US012575228B2

(12) United States Patent
Chang et al.

(10) Patent No.: US 12,575,228 B2
(45) Date of Patent: Mar. 10, 2026

(54) DISPLAY DEVICE USING MICRO LED, AND MANUFACTURING METHOD THEREFOR

(71) Applicant: LG ELECTRONICS INC., Seoul (KR)

(72) Inventors: Wonjae Chang, Seoul (KR); Jisoo Ko, Seoul (KR); Hyeyoung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 836 days.

(21) Appl. No.: 17/630,320

(22) PCT Filed: Aug. 21, 2019

(86) PCT No.: PCT/KR2019/010640
§ 371 (c)(1),
(2) Date: Jan. 26, 2022

(87) PCT Pub. No.: WO2021/033802
PCT Pub. Date: Feb. 25, 2021

(65) Prior Publication Data
US 2022/0254961 A1      Aug. 11, 2022

(30) Foreign Application Priority Data

Aug. 20, 2019      (KR) ........................ 10-2019-0101595

(51) Int. Cl.
*H10H 20/831*          (2025.01)
*H01L 23/00*           (2006.01)
(Continued)

(52) U.S. Cl.
CPC ......... *H10H 20/8314* (2025.01); *H01L 24/95* (2013.01); *H01L 25/0753* (2013.01);
(Continued)

(58) Field of Classification Search
CPC .. H10H 20/8314; H10H 20/57; H10H 29/142; H10H 20/819
See application file for complete search history.

(56) References Cited

U.S. PATENT DOCUMENTS

2013/0214302 A1      8/2013   Yeh et al.
2016/0099383 A1      4/2016   Yuh
(Continued)

FOREIGN PATENT DOCUMENTS

EP          3731274          10/2020
KR          101620469         5/2016
(Continued)

OTHER PUBLICATIONS

PCT International Application No. PCT/KR2019/010640, International Search Report dated May 20, 2020, 10 pages.
(Continued)

*Primary Examiner* — Amar Movva
(74) *Attorney, Agent, or Firm* — LEE, HONG, DEGERMAN, KANG & WAIMEY

(57)          ABSTRACT

Provided in the present specification is a novel structured semiconductor light-emitting element capable of preventing an electrode forming failure due to an arrangement error occurring during assembly or transfer of semiconductor light-emitting elements on a substrate, when a display device is implemented using the semiconductor light-emitting elements, wherein at least one of a plurality of semiconductor light-emitting elements according to one embodiment of the present disclosure comprises: a first conductive type semiconductor layer; a second conductive type semiconductor layer located on the first conductive type semiconductor layer; an active layer arranged between the first conductive type semiconductor layer and the second conductive type semiconductor layer; a second conductive type electrode located on the second conductive type semicon-
(Continued)

ductor layer; and a first conductive type electrode located on at least a one-side stepped portion of the first conductive type semiconductor layer exposed by etching a portion of the second conductive type semiconductor layer and the active layer.

10 Claims, 30 Drawing Sheets

(51) Int. Cl.

| | | |
|---|---|---|
| *H01L 25/075* | (2006.01) | |
| *H10H 20/01* | (2025.01) | |
| *H10H 20/819* | (2025.01) | |
| *H10H 20/825* | (2025.01) | |
| *H10H 20/857* | (2025.01) | |

(52) U.S. Cl.
CPC .... *H10H 20/01335* (2025.01); *H10H 20/857* (2025.01); *H01L 24/20* (2013.01); *H01L 24/29* (2013.01); *H01L 24/73* (2013.01); *H01L 24/83* (2013.01); *H01L 2224/2105* (2013.01); *H01L 2224/29006* (2013.01); *H01L 2224/73204* (2013.01); *H01L 2224/83201* (2013.01); *H01L 2224/95133* (2013.01); *H01L 2224/95136* (2013.01); *H10H 20/018* (2025.01); *H10H 20/032* (2025.01); *H10H 20/0364* (2025.01); *H10H 20/819* (2025.01); *H10H 20/825* (2025.01)

(56) References Cited

U.S. PATENT DOCUMENTS

| | | | | |
|---|---|---|---|---|
| 2017/0104009 A1* | 4/2017 | Peng | .................... | H10D 86/441 |
| 2017/0222089 A1* | 8/2017 | Park | .................... | H10H 20/825 |

FOREIGN PATENT DOCUMENTS

| | | |
|---|---|---|
| KR | 101777610 | 9/2017 |
| KR | 10-2019-0085892 | 7/2019 |
| KR | 1020190075869 | 7/2019 |
| KR | 10-2019-0092330 | 8/2019 |

OTHER PUBLICATIONS

Korean Intellectual Property Office Application No. 10-2019-0101595, Office Action dated Mar. 6, 2024, 8 pages.
European Patent Office Application Serial No. 19942041.5, Search Report dated Aug. 28, 2023, 12 pages.

* cited by examiner

DISPLAY DEVICE USING MICRO LED, AND MANUFACTURING METHOD THEREFOR

CROSS-REFERENCE TO RELATED APPLICATIONS

This application is the National Stage filing under 35 U.S.C. 371 of International Application No. PCT/KR2019/010640, filed on Aug. 21, 2019, which claims the benefit of earlier filing date and right of priority to Korean Application No. 10-2019-0101595, filed on Aug. 20, 2019, the contents of which are all hereby incorporated by reference herein their entirety.

TECHNICAL FIELD

The present disclosure relates to technology related to a display device, and more particularly to a display device using a micro-light emitting diode (micro-LED), and a method for manufacturing the display device.

BACKGROUND ART

Recently, in the field of display technology, a display device having excellent characteristics in terms of thinness and flexibility has been developed. On the other hand, currently commercialized major displays are represented by a liquid crystal display (LCD) and organic light emitting diodes (OLED).

However, in the case of the LCD, the response time is not sufficiently short and it is difficult to implement a flexible display. In the case of the OLED, the lifespan of the OLED is short and the mass production yield thereof is not good.

A light emitting diode (LED) is a light emitting semiconductor device that is well known for converting electric current into light. Red LEDs using GaAsP compound semiconductors began to be commercialized in 1962, and have been used as light sources along with GaP:N-based green LEDs for image display on electronic devices including information and communication devices. Accordingly, one solution to the above-described issues may be to implement a display using the light emitting semiconductor device. The light emitting semiconductor device has various advantages, such as a long lifespan, low power consumption, excellent characteristics related to initial driving, and high resistance against vibration, compared to a filament-based light emitting device.

In order to implement a large-area display device using semiconductor light emitting diodes (LEDs), a very large number of semiconductor LEDs should be transferred to or assembled with a substrate of the display device, and a process of forming a wiring electrode for electrically driving the semiconductor LEDs should be performed.

However, during the transfer or assembly process, an arrangement error may occur in the semiconductor LEDs. As the semiconductor LED is reduced in size, the influence of the arrangement error may increase, so that there is a higher possibility of causing defective products in the process of forming a wiring electrode.

Accordingly, the present disclosure provides a new type of semiconductor LED capable of minimizing the possibility of causing defective wiring electrodes.

DISCLOSURE

Technical Problem

An object of the present disclosure is to provide a display device using semiconductor LEDs and a method for manufacturing the same.

Another object of the present disclosure is to provide a new semiconductor LED wiring electrode capable of preventing occurrence of a defective wiring electrode caused by an arrangement error generated in a process of assembling or transferring the semiconductor LEDs onto a substrate when a display device is implemented using semiconductor LEDs.

Another object of the present disclosure is to address various issues not mentioned herein. The objects of the present disclosure will be understood by those skilled in the art through the whole spirit of the specification and drawings.

Technical Solutions

In accordance with an aspect of the present disclosure, a display device using a semiconductor light emitting diode (LED) may include a substrate; an assembly electrode disposed over the substrate; an insulation layer disposed over the assembly electrode; a barrier disposed over the insulation layer; an assembly groove defined by the barrier; and a semiconductor LED assembled into the assembly groove. The semiconductor LED may include a first conductive semiconductor layer; a second conductive semiconductor layer disposed over the first conductive semiconductor layer; an active layer disposed between the first conductive semiconductor layer and the second conductive semiconductor layer; a second conductive electrode disposed over the second conductive semiconductor layer; and a first conductive electrode disposed on a stepped portion of at least one side of the first conductive semiconductor layer exposed by etching of some parts of the second conductive semiconductor layer and the active layer.

The first conductive electrode may be formed to extend from one side of the first conductive semiconductor layer to a portion of a top surface of the first conductive semiconductor layer exposed.

The first conductive electrode may be formed on all sides of the first conductive semiconductor layer.

The first conductive semiconductor layer of the semiconductor LED may be in contact with a bottom surface of the assembly groove; and an assembly surface of the first conductive semiconductor layer contacting the bottom surface may be formed in a circular shape.

The first conductive electrode may protrude from one side of the first conductive semiconductor layer.

The barrier may include a protrusion formed to protrude toward a center part of the assembly groove, wherein the protrusion of the barrier and a first conductive electrode of the semiconductor LED are engaged with each other.

The assembly groove defined by the barrier other than the protrusion may be formed in a circular shape.

The first conductive electrode of the semiconductor LED and the protrusion located in the barrier may be engaged with each other in a serrate shape.

The semiconductor LED may include a magnetic layer.

The display device may further include a first wiring electrode electrically connected to the first conductive electrode of the semiconductor LED; and a second wiring electrode electrically connected to the second conductive electrode of the semiconductor LED.

The semiconductor LED may be a micro-LED having a size of a micrometer (μm) unit.

In accordance with another aspect of the present disclosure, a method for manufacturing a display device may include forming a semiconductor light emitting diode (LED) having a side electrode in a growth substrate; preparing an assembly substrate having an assembly electrode and an assembly groove; separating the semiconductor LED from the growth substrate, and injecting the separated semiconductor LED into a chamber filled with fluid; allowing the assembly substrate to be disposed at a top surface of the chamber, and assembling the semiconductor LED into the assembly groove of the substrate using a magnetic field and an electric field; and forming a wiring electrode electrically connected to a side electrode of the semiconductor LED assembled into the assembly groove.

The assembly groove of the substrate may be defined by a barrier surrounding the assembly groove, wherein the barrier includes a protrusion formed to protrude inward from the assembly groove.

A side electrode of the semiconductor LED may protrude laterally from one surface assembled with the semiconductor LED. The semiconductor LED contacting a bottom surface of the assembly groove other than the side electrode may have an assembly surface formed in a circular shape.

The semiconductor LED may include a magnetic layer. The assembling step may include allowing the semiconductor LED to be in contact with the assembly groove of the substrate through a magnetic field by an assembly device in which a magnetic body is provided at a back surface portion of the substrate in which the assembly groove is not located; and fixing the semiconductor LED to the assembly groove by an electric field generated when a voltage is applied to the assembly electrode.

The contacting step of the semiconductor LED may include placing the semiconductor LED at a bottom surface of the assembly groove; and allowing the semiconductor LED to rotate in the assembly groove in a manner that the side electrode of the semiconductor LED is in contact with the protrusion of the barrier.

In accordance with another aspect of the present disclosure, a display device having a plurality of semiconductor light emitting diodes (LEDs) may include at least one of the plurality of semiconductor LEDs including: a first conductive semiconductor layer; a second conductive semiconductor layer disposed over the first conductive semiconductor layer; an active layer disposed between the first conductive semiconductor layer and the second conductive semiconductor layer; a second conductive electrode disposed over the second conductive semiconductor layer; and a first conductive electrode disposed on a stepped portion of at least one side of the first conductive semiconductor layer exposed by etching of some parts of the second conductive semiconductor layer and the active layer.

Advantageous Effects

As is apparent from the above description, the embodiments of the present disclosure can provide a display device using semiconductor LEDs and a method for manufacturing the same.

Specifically, according to the embodiments of the present disclosure, a semiconductor LED having a side electrode is transferred to or assembled with a substrate, and a wiring process is then performed on the side electrode. The semiconductor LED according to the present disclosure has a wider wiring process margin compared to a conventional semiconductor LED, such that short circuiting between electrodes can be prevented from occurring in the wiring process.

Further, according to another embodiment of the present disclosure, there are additional technical effects not mentioned here. Those skilled in the art can understand the present disclosure through the purposes of the specification and drawings.

DESCRIPTION OF DRAWINGS

FIG. 2 is a partially enlarged view showing part A of FIG. 1;

FIG. 8 is a cross-sectional diagram taken along a cutting line D-D shown in FIG. 8.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "mod-ule" and "unit" are added or used interchangeably to facili-tate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy under-standing of the embodiments disclosed in the present speci-fication, and should not be construed as limiting the tech-nical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting termi-nal, a personal digital assistant (PDA), a portable multime-dia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the light emitting semiconductor device men-tioned in this specification is a concept including an LED, a micro LED, and the like, and may be used interchangeably therewith.

Figure 1:
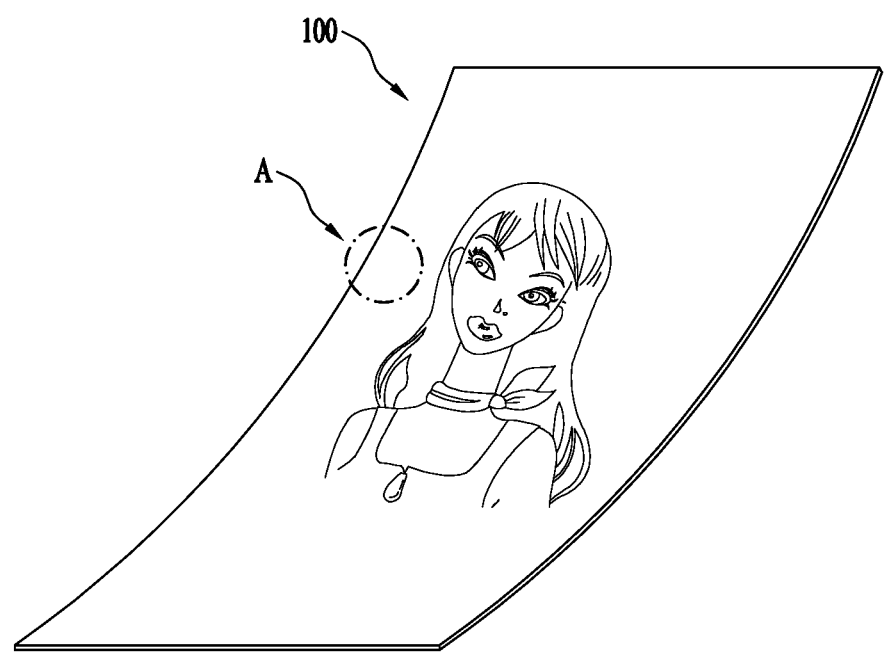
FIG. 1 is a conceptual view illustrating an embodiment of a display device using a light emitting semiconductor device according to the present disclosure.

FIG. 1 is a conceptual view illustrating an embodiment of a display device using a light emitting semiconductor device according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by indepen-dently controlling the light emission of sub-pixels arranged in a matrix form. The unit pixel may mean, for example, a minimum unit for implementing one color.

The unit pixel of the flexible display may be implemented by a light emitting semiconductor device. In the present disclosure, a light emitting diode (LED) is exemplified as a type of the light emitting semiconductor device configured to convert electric current into light. The LED may be formed in a small size, and may thus serve as a unit pixel even in the second state.

Hereinafter, a flexible display implemented using the LED will be described in more detail with reference to the drawings.

Figure 2:
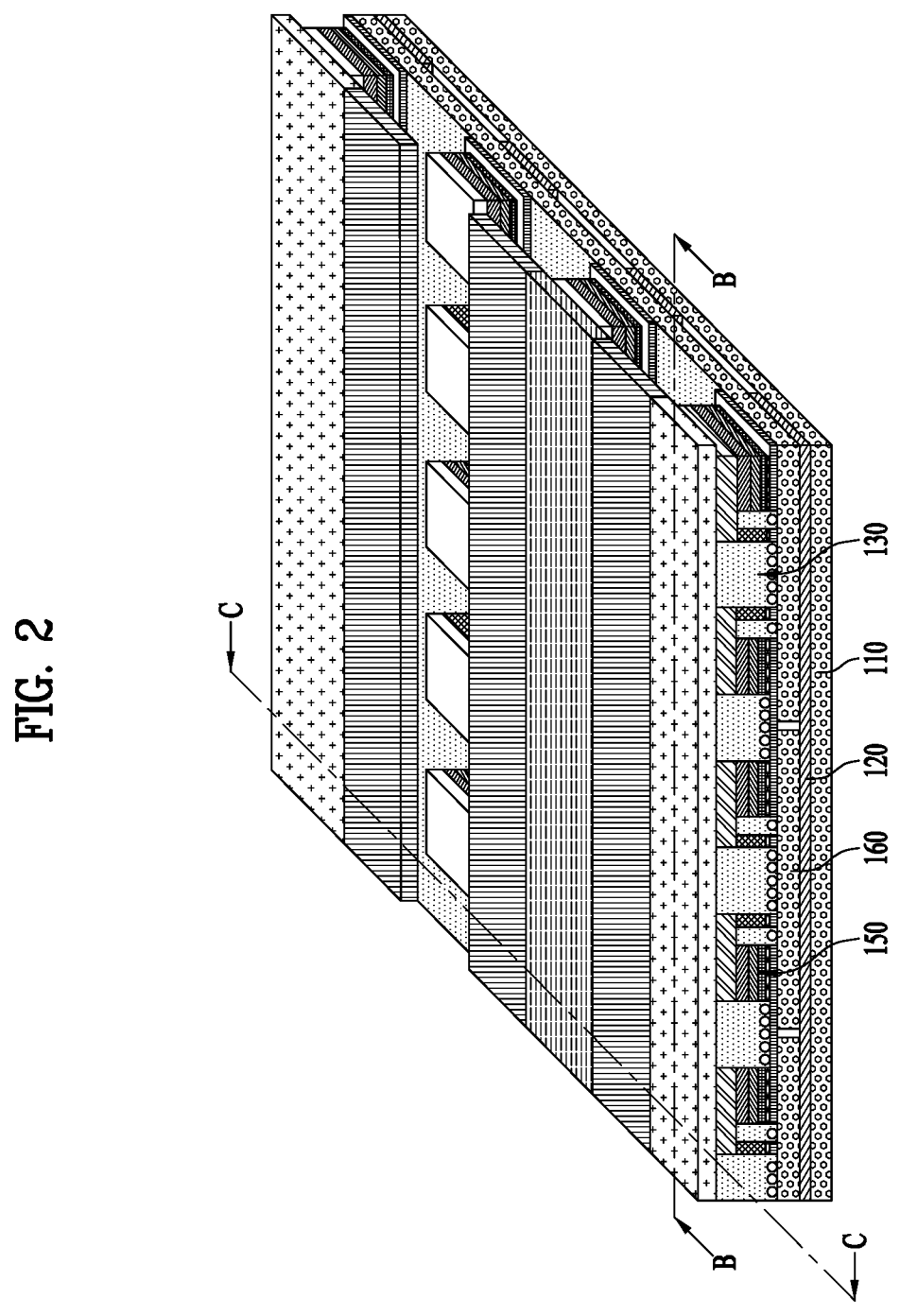
Figure 3A:
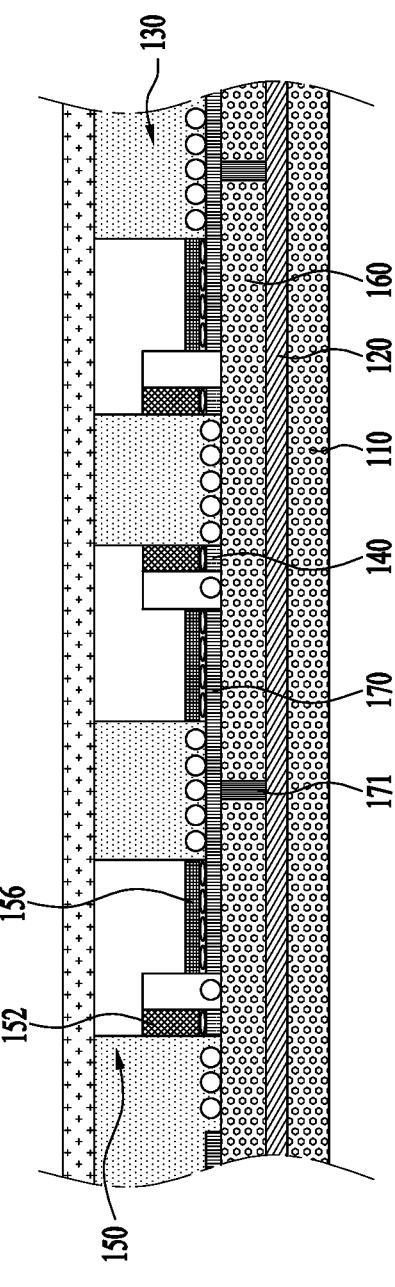
FIGS. 3A and 3B are cross-sectional views taken along lines B-B and C-C in FIG. 2.
Figure 3B:
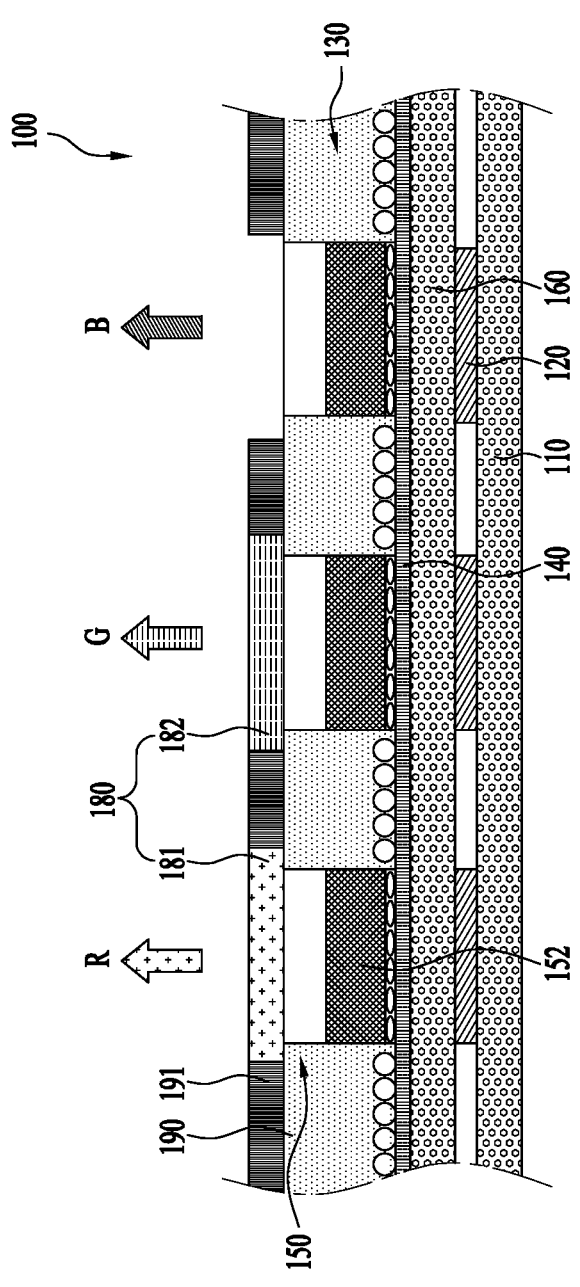

FIG. 2 is a partially enlarged view showing part A of FIG. 1;

FIGS. 3A and 3B are cross-sectional views taken along lines B-B and C-C in FIG. 2.

Figure 4:
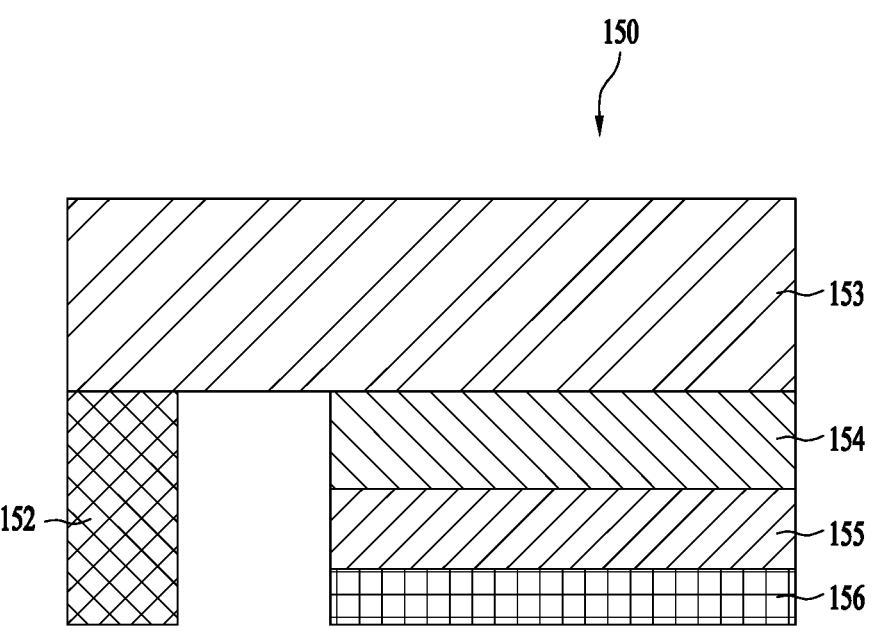
FIG. 4 is a conceptual view illustrating the flip-chip type light emitting semiconductor device of FIG. 3.

FIG. 4 is a conceptual view illustrating the flip-chip type light emitting semiconductor device of FIG. 3.

Figure 5A:
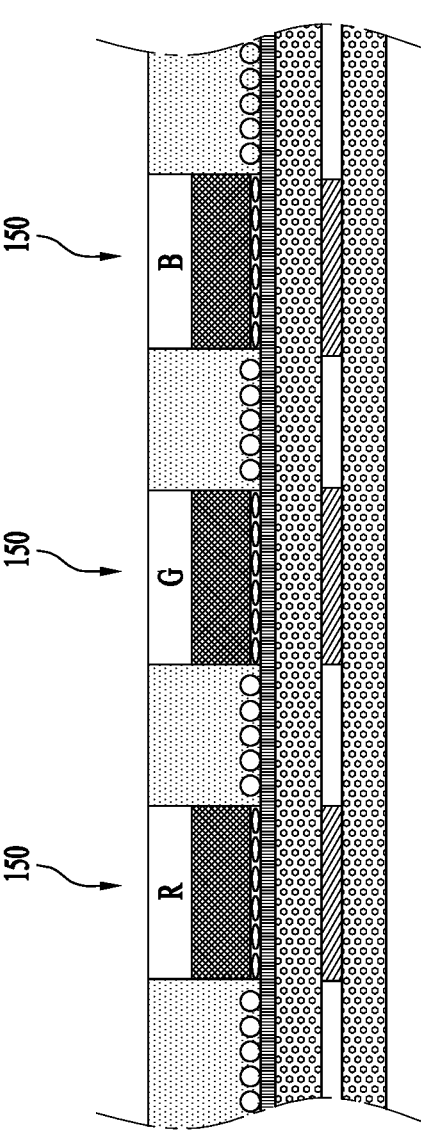
FIGS. 5A to 5C are conceptual views illustrating various examples of implementation of colors in relation to a flip-chip type light emitting semiconductor device.
Figure 5B:
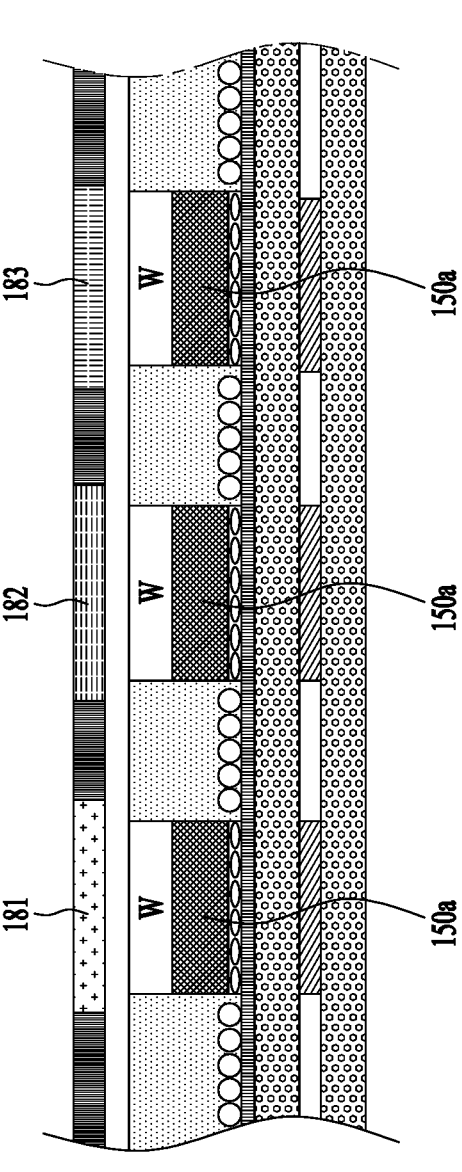
Figure 5C:
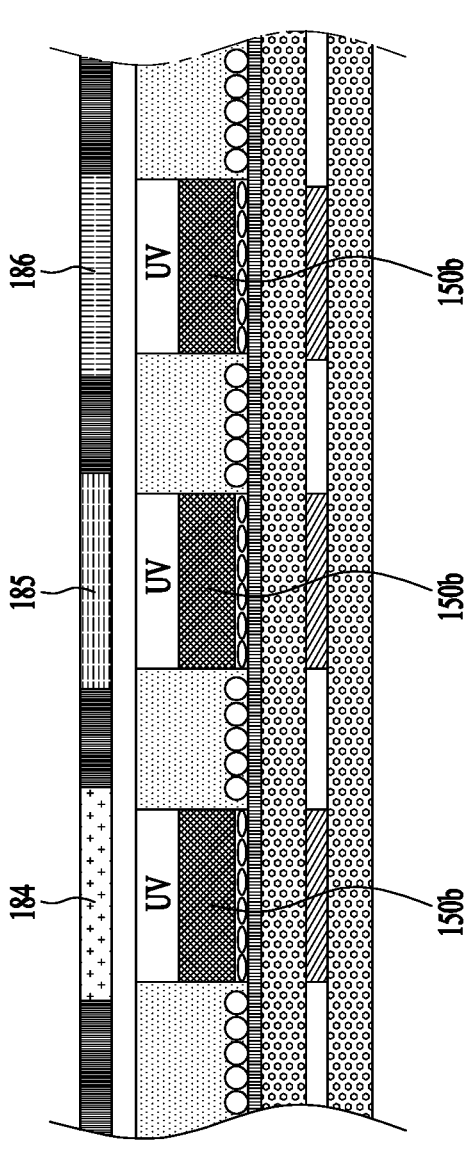

FIGS. 5A to 5C are conceptual views illustrating various examples of implementation of colors in relation to a flip-chip type light emitting semiconductor device.

As shown in FIGS. 2, 3A and 3B, the display device 100 using a passive matrix (PM) type light emitting semicon-ductor device is exemplified as the display device 100 using a light emitting semiconductor device. However, the examples described below are also applicable to an active matrix (AM) type light emitting semiconductor device.

The display device 100 shown in FIG. 1 may include a substrate 110, a first electrode 120, a conductive adhesive layer 130, a second electrode 140, and at least one light emitting semiconductor device 150, as shown in FIG. 2.

The substrate 110 may be a flexible substrate. For example, to implement a flexible display device, the sub-strate 110 may include glass or polyimide (PI). Any insula-tive and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the light emitting semiconductor device 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the light emitting semiconductor device 150 is connected thereto in a flip-chip form by applying heat and pressure. Thereby, the light emitting semiconductor device 150 is electrically connected to the first electrode 120 and the second electrode 140.

Referring to FIG. 4, the light emitting semiconductor device may be a flip chip-type light emitting device.

For example, the light emitting semiconductor device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of light emitting semiconductor devices 150. For example, p-type electrodes of light emitting semiconductor devices on left and right sides of an auxiliary electrode may be electrically connected to one auxiliary electrode.

More specifically, the light emitting semiconductor device 150 may be press-fitted into the conductive adhesive layer 130 by heat and pressure. Thereby, only the portions of the light emitting semiconductor device 150 between the p-type electrode 156 and the auxiliary electrode 170 and between the n-type electrode 152 and the second electrode 140 may exhibit conductivity, and the other portions of the light emitting semiconductor device 150 do not exhibit conductivity as they are not press-fitted. In this way, the conductive adhesive layer 130 interconnects and electrically connects the light emitting semiconductor device 150 and the auxiliary electrode 170 and interconnects and electrically connects the light emitting semiconductor device 150 and the second electrode 140.

The plurality of light emitting semiconductor devices 150 may constitute a light emitting device array, and a phosphor conversion layer 180 may be formed on the light emitting device array.

The light emitting device array may include a plurality of light emitting semiconductor devices having different luminance values. Each light emitting semiconductor device 150 may constitute a unit pixel and may be electrically connected to the first electrode 120. For example, a plurality of first electrodes 120 may be provided, and the light emitting semiconductor devices may be arranged in, for example, several columns. The light emitting semiconductor devices in each column may be electrically connected to any one of the plurality of first electrodes.

In addition, since the light emitting semiconductor devices are connected in a flip-chip form, light emitting semiconductor devices grown on a transparent dielectric substrate may be used. The light emitting semiconductor devices may be, for example, nitride light emitting semiconductor devices. Since the light emitting semiconductor device 150 has excellent luminance, it may constitute an individual unit pixel even when it has a small size.

As shown in FIG. 3, a partition wall 190 may be formed between the light emitting semiconductor devices 150. In this case, the partition wall 190 may serve to separate individual unit pixels from each other, and may be integrated with the conductive adhesive layer 130. For example, by inserting the light emitting semiconductor device 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor layer 180 may be positioned on the outer surface of the light emitting semiconductor device 150. For example, the light emitting semiconductor device 150 may be a blue light emitting semiconductor device that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue light emitting semiconductor device at a position of a unit pixel of red color, and the green phosphor 182 capable of converting blue light into green (G) light may be laminated on the blue light emitting semiconductor device at a position of a unit pixel of green color. Only the blue light emitting semiconductor device may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the light emitting semiconductor device 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each light emitting semiconductor device 150 may be implemented as a high-power light emitting device emitting light of various colors including blue by using gallium nitride (GaN) as a main material and adding indium (In) and/or aluminum (Al).

In this case, each light emitting semiconductor device 150 may be a red, green, or blue light emitting semiconductor device to form a unit pixel (sub-pixel). For example, red, green, and blue light emitting semiconductor devices R, G, and B may be alternately disposed, and unit pixels of red, green, and blue may constitute one pixel by the red, green and blue light emitting semiconductor devices. Thereby, a full-color display may be implemented.

Referring to FIG. 5B, the light emitting semiconductor device 150*a* may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the light emitting semiconductor device. In an embodiment, UV may be used as an excitation source of the upper phosphor in the light emitting semiconductor device.

Referring back to this example, the light emitting semiconductor device is positioned on the conductive adhesive layer to constitute a unit pixel in the display device. Since the light emitting semiconductor device has excellent luminance, individual unit pixels may be configured despite even when the light emitting semiconductor device has a small size.

Regarding the size of such an individual light emitting semiconductor device, the length of each side of the device may be, for example, 80 μm or less, and the device may have a rectangular or square shape. When the light emitting semiconductor device has a rectangular shape, the size thereof may be less than or equal to 20 μm×80 μm.

In addition, even when a square light emitting semiconductor device having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
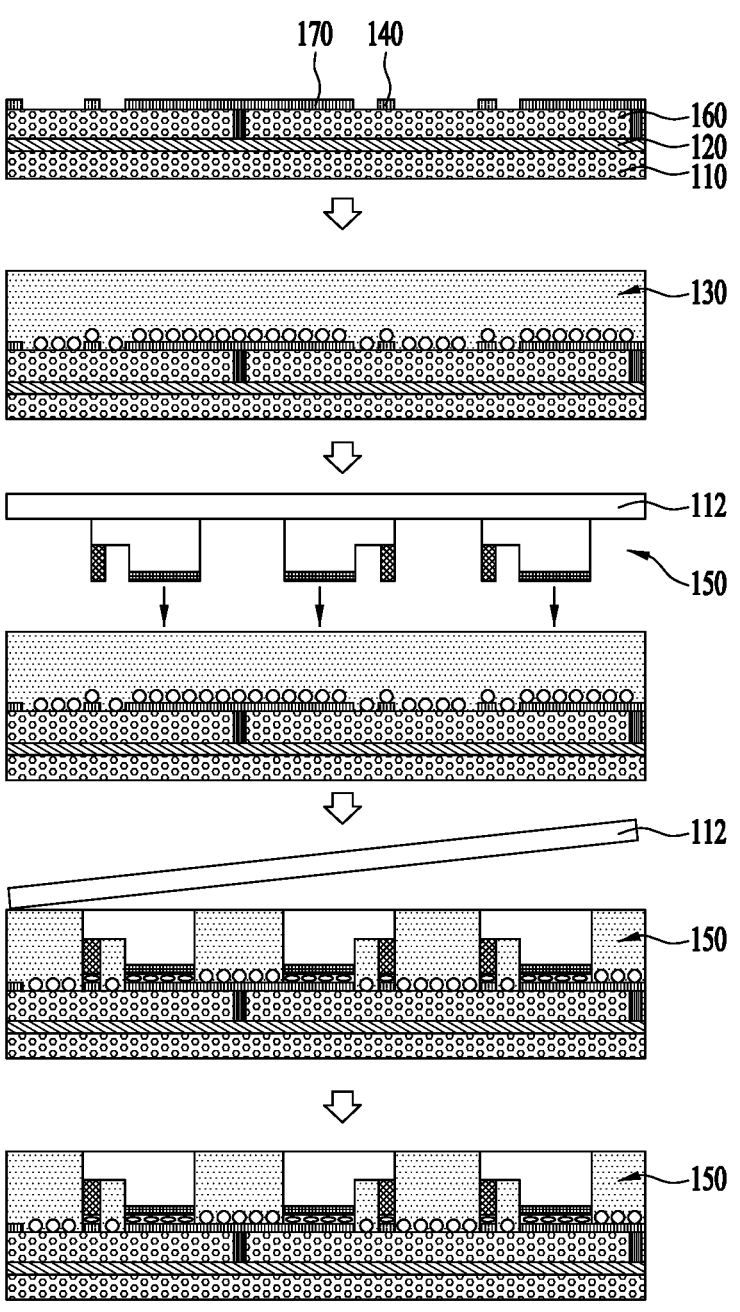
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
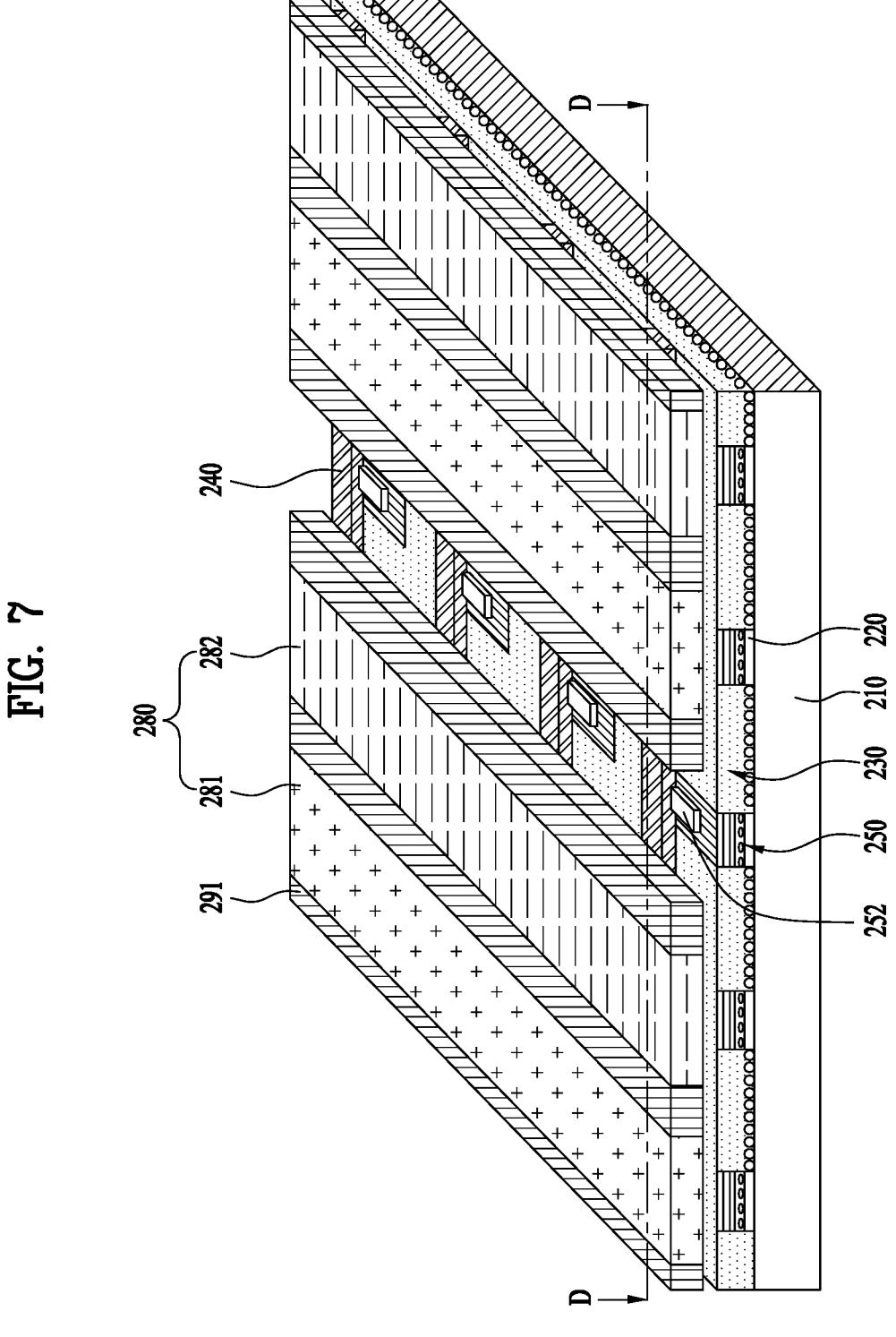
FIG. 7 is a perspective diagram of a display device using a semiconductor light emitting element according to another embodiment of the present disclosure.
Figure 8:
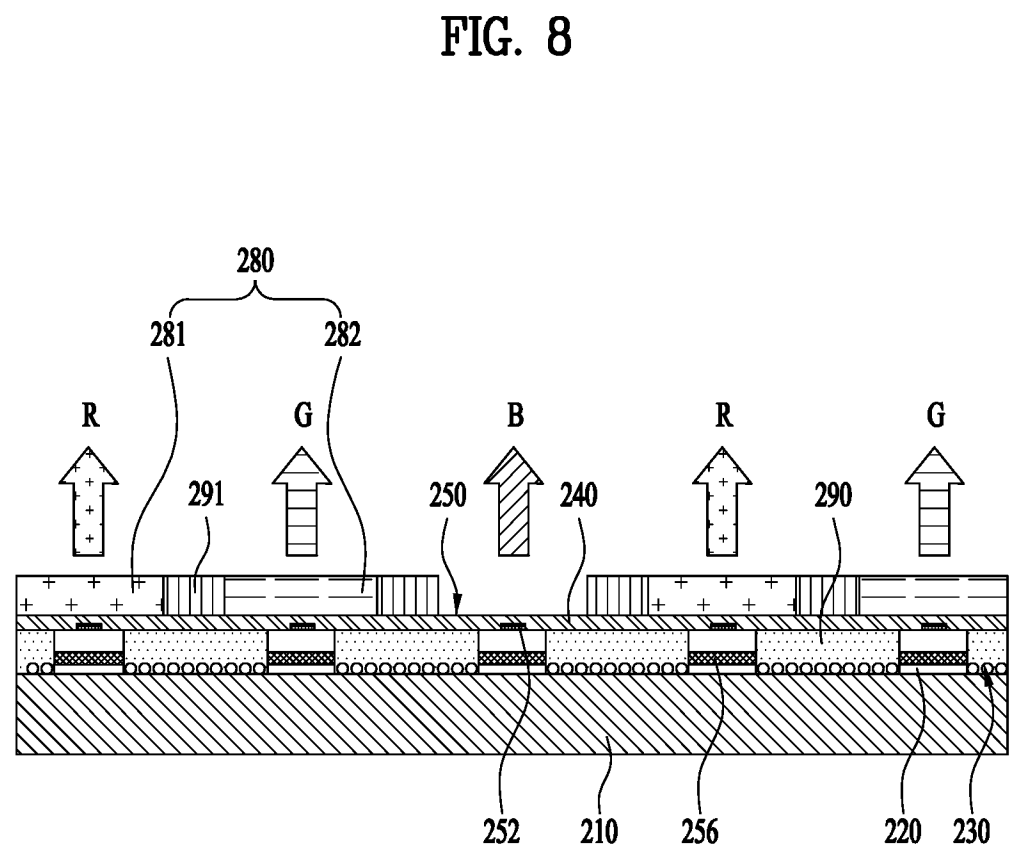
Figure 9:
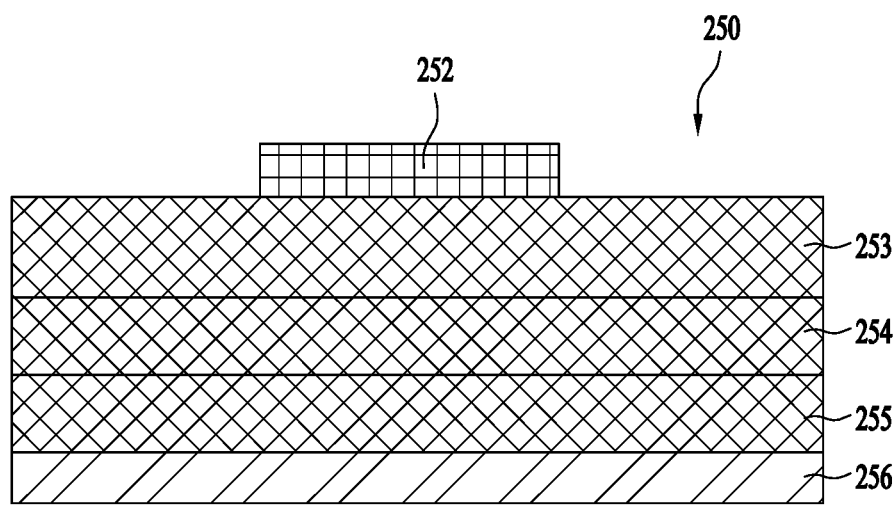
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
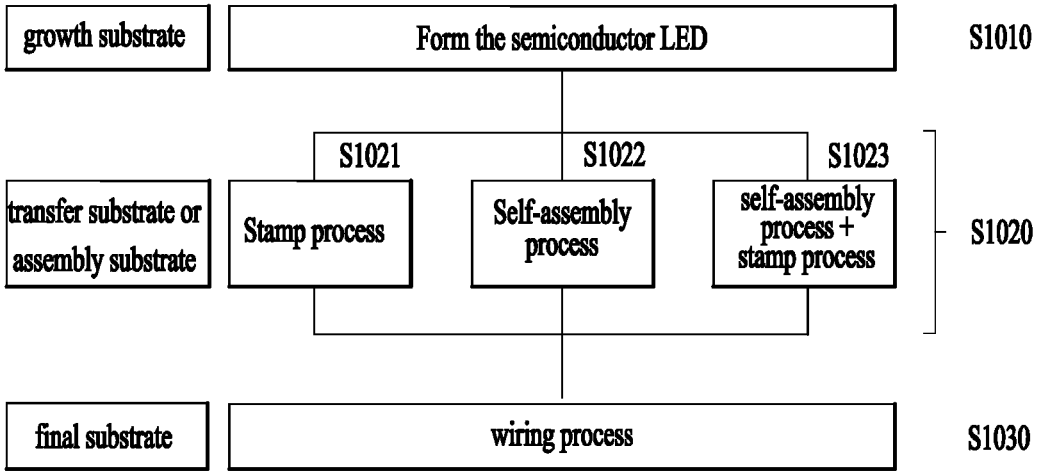
FIG. 10 is a flowchart illustrating a method for manufacturing a display device using semiconductor LEDs.

FIG. 10 is a flowchart illustrating a method for manufacturing a display device using semiconductor LEDs.

Referring to FIG. 10, the semiconductor LEDs may be formed over a growth substrate (S1010). Each of the semiconductor LEDs may include a first conductive semiconductor layer, an active layer, and a second conductive semiconductor layer. In addition, the semiconductor LED may further include the first conductive electrode formed over the first conductive semiconductor layer and the second conductive electrode formed over the second conductive semiconductor layer.

The semiconductor LEDs may be implemented as horizontal semiconductor LEDs and/or vertical semiconductor LEDs. However, in the vertical semiconductor LED, since the first conductive electrode and the second conductive electrode are arranged to face each other, a process of separating the semiconductor LED from a growth substrate and forming a unidirectional conductive electrode may be added to a subsequent process. As will be described later, the semiconductor LED may include a magnetic layer for implementation of a self-assembly process.

In order for the semiconductor LEDs to be used for a display device, three types of semiconductor LEDs that respectively emit red light (R), green light (G), and blue light (B) are required. Since semiconductor LEDs emitting one color are formed in a single growth substrate, a separate substrate is required for a display device capable of implementing the respective unit pixels using the above three types of semiconductor LEDs. Therefore, the respective semiconductor LEDs should be separated from the growth substrate, and the separated semiconductor LEDs should be assembled with or transferred to a final substrate. Here, the final substrate is a substrate in which a wiring electrode capable of applying a voltage to the semiconductor LEDs is formed such that each of the semiconductor LEDs can emit light.

Accordingly, the semiconductor LEDs configured to emit different colors of light may move to the transfer substrate or the assembly substrate (S1020), and may be re-transferred onto the final substrate. If necessary, when the wiring process is performed directly on the transfer substrate or the assembly substrate, the transfer substrate or the assembly process may serve as the final substrate.

The method (1020) for arranging the semiconductor LEDs in the transfer substrate or the assembly substrate can be broadly classified into the following three methods (i.e., a first method, a second method, and a third method).

In the first method, the semiconductor LED may move from the growth substrate to the transfer substrate by a stamp process (S1021). The stamp process may refer to a process for separating the semiconductor from the growth substrate through a protrusion having adhesive force using a flexible substrate having the protrusion. As a result, the semiconductor LED can be selectively separated from the growth substrate through adjustment of the spacing between protrusions and arrangement of the protrusions.

In the second method, the semiconductor LED may be assembled into the assembly substrate using the self-assembly process (S1022). For the self-assembly process, each of the semiconductor LEDs should be separated from the growth substrate, as many semiconductor LEDs as the required number of semiconductor LEDs may be separated from the growth substrate through a Laser Lift Off (LLO) process or the like. Thereafter, the semiconductor LEDs are dispersed in fluid and assembled into the assembly substrate using an electromagnetic field.

The self-assembly process may be implemented by simultaneously assembling the semiconductor LEDs respectively emitting red light (R), green light (G), and blue light (B) into one assembly substrate, or may be implemented by assembling different colors of semiconductor LEDs into the respective assembly substrates.

In the third method, the stamp process and the self-assembly process are mixed (S1023). First, the semiconductor LEDs may first be located at the assembly substrate through the self-assembly process, and may then move to the final substrate through the stamp process. It is difficult for the assembly substrate to be implemented as a large-area assembly substrate due to the location of the assembly substrate disposed in the self-assembly process, contact with fluid, and the influence of electromagnetic fields. Accordingly, after the semiconductor LEDs are assembled using the assembly substrate having an appropriate area, the transfer process may be repeatedly performed on the final large-area substrate by the stamp process as needed.

When the plurality of semiconductor LEDs constructing each unit pixel is arranged in the final substrate, a wiring process for electrically interconnecting the semiconductor LEDs may be performed (S1030).

Since countless semiconductor LEDs are required to implement a large-area display device, the self-assembly process may be preferable. In order to improve the assembly speed, it may be preferable that the semiconductor LEDs be simultaneously assembled into one assembly substrate during the self-assembly process. In addition, in order for the semiconductor LEDs having different colors to be assembled at a preset specific position of the assembly substrate, there is a need for the semiconductor LEDs to have a mutually exclusive structure.

Figure 11:
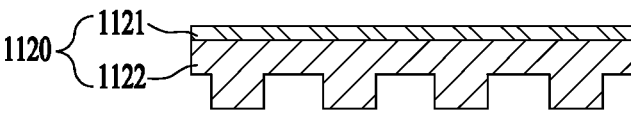
FIG. 11 is a diagram illustrating a method for assembling semiconductor LEDs into a substrate by a stamp process according to one embodiment of the present disclosure.
Figure 11:
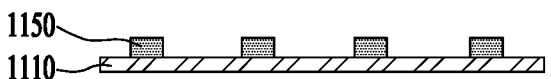
Figure 11:
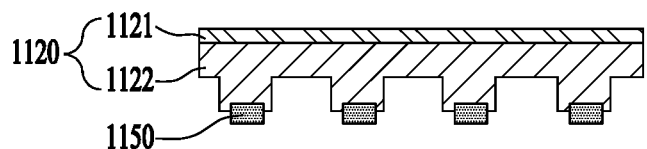
Figure 11:
Figure 11:
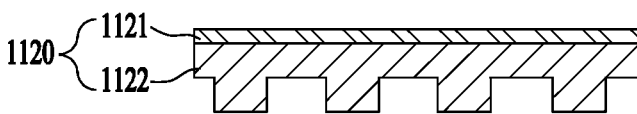
Figure 11:
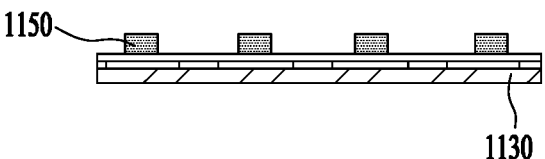

FIG. 11 is a diagram illustrating a method for assembling the semiconductor LEDs into the substrate by the stamp process according to one embodiment of the present disclosure.

As described above, the stamp process may use a flexible substrate having one or more protrusions.

Referring to FIG. 11(*a*), the flexible substrate formed with protrusions may be a transfer substrate 1120 including a base layer 1121 and an organic stamp layer 1122.

For transfer through the stamp process, the semiconductor LEDs 1150 formed in the growth substrate 1110 may be aligned vertically with the transfer substrate 1120.

The organic stamp layer 1122 of the transfer substrate 1120 may have sufficient adhesive force to transfer the semiconductor LEDs 1150.

The organic stamp layer 1122 may include a plurality of protrusions arranged at intervals of a predetermined distance such that the protrusions can be regularly arranged in correspondence with the spacing between the semiconductor LEDs 1150 of the growth substrate 1110.

Referring to FIG. 11(*b*), the semiconductor LEDs 1150 may be stably transferred onto the protrusions placed in the organic stamp layer 1122.

The organic stamp layer 1122 may be formed of a flexible film material such as polydimethylsiloxane (PDMS). The base layer 1121 of the transfer substrate 1120 may include at least one of polyethylene terephthalate (PET), polycarboxy-late ether (PCE), and glass. Therefore, the base layer 1121 can stably support the organic stamp layer 1122 during the transfer process.

FIG. 11(*c*) is a cross-sectional view illustrating the structure formed when the semiconductor LEDs are transferred from the organic stamp layer 1122 of the transfer substrate 1120 to the wiring substrate 1130.

As described above, the base layer 1121 of the transfer substrate 1120 may serve to stably support the organic stamp layer 1122 of the transfer substrate during a substrate-to-substrate compression stage in such a transfer process.

On the other hand, the wiring substrate 1130 may be formed with an electrode unit for electrically connecting each of the semiconductor LEDs 1150 to the wiring substrate 1130.

In addition, the stamp process based on the transfer substrate 1120 of FIG. 11 may be performed several times according to various purposes. For example, not only for movement from the growth substrate to the wiring substrate, but also for formation of a light extraction structure or an electrode structure in a specific direction of the semiconductor LEDs, the stamp process may be used to perform such transfer on a separate substrate. In addition, in order to perform such transfer in the direction from the assembly substrate to another substrate after completion of self-assembly, the stamp process may also be performed as needed.

Figure 12:
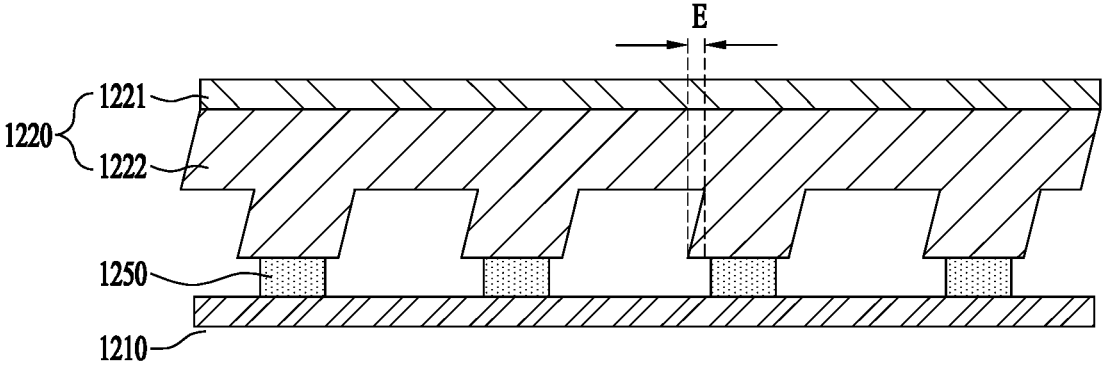
FIG. 12 is a diagram illustrating an arrangement error between semiconductor LEDs that may occur in a stamp process.

FIG. 12 is a diagram illustrating an arrangement error between semiconductor LEDs that may occur in a stamp process.

Referring to FIG. 12, for the stamp process, the base layer 1221 of the transfer substrate 1220 has rigidity while serving as a support member, but the organic stamp layer 1222 may be formed of a flexible material. Therefore, in the process of transferring the semiconductor LEDs 1250 on the growth substrate 1210, the organic stamp layer 1222 may be deformed, and the deformation may cause an arrangement error between the semiconductor LEDs 1250.

Referring to FIG. 12, a distance change (E) in the organic stamp layer 1222 may be directly reflected into the wiring substrate to be finally transferred, so that an unexpected problem may occur in formation of the wiring electrode due to the influence of such distance change. In view of the current technology level, for example, in a situation where the size of each semiconductor LED is set to 50 μm, if the arrangement error (distance change) is 5 μm or greater, short circuiting is likely to occur.

Figure 13:
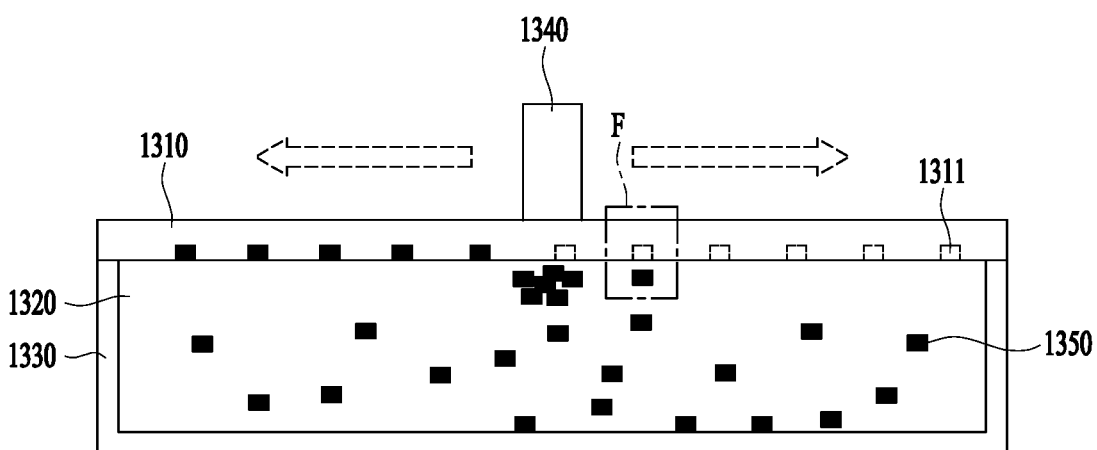
FIG. 13 is a diagram illustrating a method for assembling semiconductor LEDs into a substrate by a self-assembly process according to one embodiment of the present disclosure.

FIG. 13 is a diagram illustrating a method for assembling semiconductor LEDs into the substrate by the self-assembly process according to one embodiment of the present disclosure.

Figure 14:
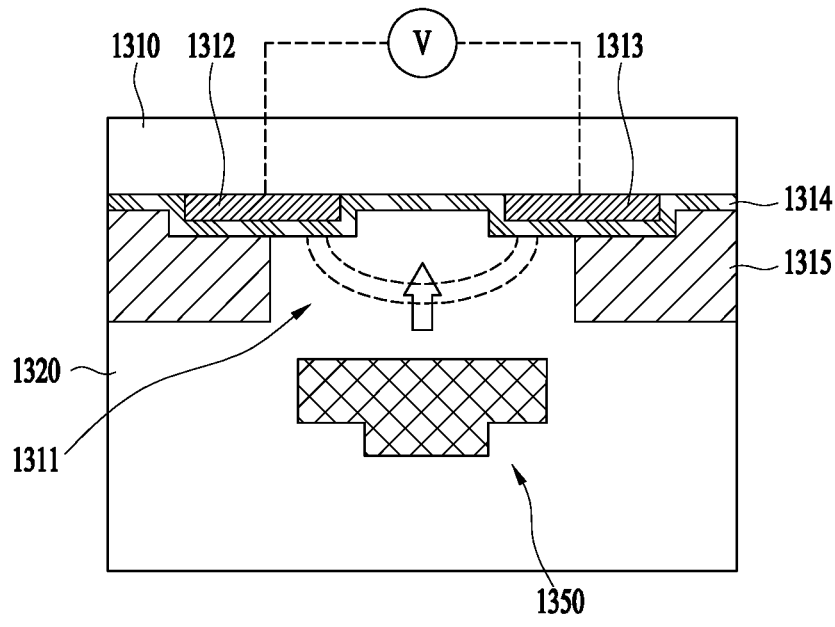
FIG. 14 is an enlarged view illustrating a specific portion D of FIG. 13.

FIG. 14 is an enlarged view illustrating the specific portion D of FIG. 13.

Referring to FIGS. 13 and 14, the semiconductor LEDs 1350 may be introduced into a chamber 1330 filled with fluid 1320.

Thereafter, the assembly substrate 1310 may be disposed on the chamber 1330. In one embodiment, the assembly substrate 1310 may also be put into the chamber 1330. At this time, the direction in which the assembly substrate 1310 is inserted may refer to a direction along which the groove 1311 is arranged to face the fluid 1320.

One pair of two electrodes 1312 and 1313 corresponding to the respective semiconductor LEDs 1350 to be assembled may be formed in the assembly substrate 1310. The electrodes 1312 and 1313 may be implemented as a transparent electrode such as indium tin oxide (ITO) or may also be formed of other general materials as needed. The electrodes 1312 and 1313 may generate an electric field upon receiving a voltage, and may be used as assembly electrodes capable of stably fixing the semiconductor LEDs 1350 contacting the assembly grooves 1312 and 1313.

Specifically, an AC voltage may be applied to the electrodes 1312 and 1313, and each of the semiconductor LEDs 1350 floating around the electrodes 1312 and 1313 may have a polarity by dielectric polarization. In addition, the dielectrically polarized semiconductor LED may be moved or fixed in a specific direction by a non-uniform electric field formed around the electrodes 1312 and 1313. This operation is referred to as dielectrophoresis. In the self-assembly process of the present disclosure, the semiconductor LEDs 1350 can be stably fixed to the assembly grooves 1312 and 1313 using dielectrophoresis.

For example, the spacing between the assembly electrodes 1312 and 1313 may be smaller than the width of the semiconductor LED 1350 or the diameter of each assembly groove 1311, so that the assembly position of the semiconductor LEDs 1350 can be more precisely fixed using the electric field.

In addition, an insulation layer 1314 may be formed over the assembly electrodes 1312 and 1313 to protect the electrodes 1312 and 1313 from the fluid 1320 and to prevent leakage of current flowing through the assembly electrodes 1312 and 1313. For example, the insulation layer 1314 may be formed of an inorganic insulator such as silica or alumina or an inorganic insulator as a monolayer or multilayer structure. In addition, the insulation layer 1314 may have a minimum thickness to prevent damage to the assembly electrodes 1312 and 1313 when the semiconductor LEDs 1350 are assembled, and may have a maximum thickness to stably assemble the semiconductor LEDs 1350.

A partition wall (barrier) 1315 may be formed over the insulation layer 1314. A partial region of the partition wall (barrier) 1315 may be disposed over the assembly electrodes 1312 and 1313, and the remaining regions other than the partial region may be disposed over the assembly substrate 1310.

For example, when the assembly substrate 1310 is manufactured, some of the partition wall (barrier) formed over the entire upper portion of the insulation layer 1314 may be removed, thereby forming the assembly grooves 1311 where the semiconductor LEDs 1310 are coupled to the assembly substrate 1310.

Referring to FIG. 14, the assembly groove 1311 coupled to the semiconductor LED 1350 may be formed in the assembly substrate 1310, and a surface where the assembly groove 1311 is formed may be in contact with the fluid 1320. The assembly groove 1311 can guide an accurate assembly position of the semiconductor LED 1350.

In addition, the barrier 1315 may be formed with a predetermined slope from the opening of the assembly groove 1311 toward the bottom surface. For example, through adjustment of the slope of the barrier 1315, the assembly groove 1311 may include the opening and the bottom surface, and the opening may be formed to have a larger area than the bottom surface. Accordingly, the semiconductor LEDs 1350 may be assembled at an accurate position of the bottom surface of the assembly groove 1311.

Meanwhile, the assembly groove 1311 may have a shape and a size corresponding to the shape of the semiconductor LED 1350 to be assembled. As a result, it is possible to prevent other semiconductor LEDs from being assembled into the assembly groove 1311 or to prevent a plurality of semiconductor LEDs from being assembled into the assembly groove 1311.

In addition, the depth of the assembly groove 1311 may be smaller than a vertical height of each semiconductor LED 1350. Accordingly, the semiconductor LED 1350 may be formed to protrude from the spacing between the barriers 1315, and may easily contact a protrusion of the transfer substrate in a transfer process after completion of the assembly process.

Also, as shown in FIG. 13, after the assembly substrate 1310 is disposed, an assembly device 1340 including the magnetic body may move along the assembly substrate 1310. The assembly device 1340 may move in contact with the assembly substrate 1310 so as to maximize the region to be affected by the magnetic field within the fluid 1320. For example, the assembly device 1340 may include a plurality of magnetic bodies or may include a magnetic body having a size corresponding to the assembly substrate 1310. In this case, the movement distance of the assembly device 1340 may be limited to within a predetermined range.

By the magnetic field generated by the assembly device 1340, the semiconductor LEDs 1350 in the chamber 1330 may move toward the assembly device 1340.

While the semiconductor LED 1350 moves toward the assembly device 1340, the semiconductor LED 1350 may enter the assembly groove 1311 and thus contact the assembly substrate 1310 as shown in FIG. 14.

In addition, each of the semiconductor LEDs 1350 may include a magnetic layer so that the self-assembly process can be performed.

On the other hand, due to an electric field generated by the assembly electrodes 1312 and 13134 of the assembly substrate 1310, the semiconductor LED 1350 contacting the assembly substrate 1310 can be prevented from being separated by movement of the assembly device 1340.

Therefore, according to the self-assembly method using the electromagnetic field shown in FIGS. 13 and 14, the plurality of semiconductor LEDs 1350 can be simultaneously assembled into the semiconductor substrate 1310.

Figure 15:
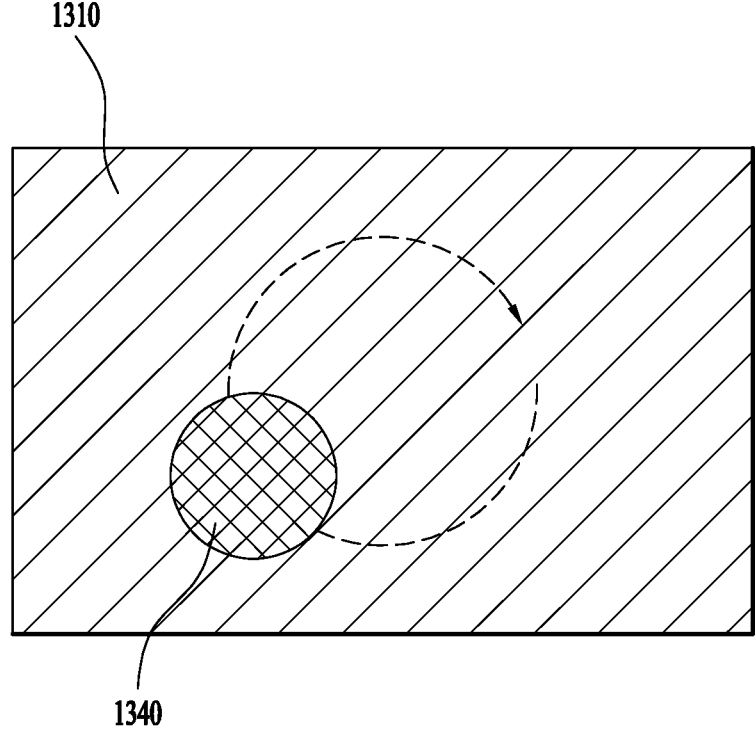
FIG. 15 is a diagram illustrating an example of a movement direction of an assembly device having a magnetic body during a self-assembly process according to one embodiment of the present disclosure.

FIG. 15 is a diagram illustrating an example of a movement direction of the assembly device having a magnetic body during the self-assembly process according to one embodiment of the present disclosure.

As described above, the assembly device 1340 including the magnetic body may operate on a back surface of the substrate where the assembly groove is not formed, and may generate a magnetic field so that the semiconductor LED can be in contact with the assembly groove of the substrate through the magnetic field.

The assembly device 1340 may perform linear motion and rotational motion in all directions at the back surface of the substrate 1310.

FIG. 15 is a diagram illustrating one example in which the assembly device 1340 rotates in a clockwise direction at the back surface of the substrate 1310. The semiconductor LED contacting the assembly groove of the substrate through the rotational movement of the assembly device may also rotate in the assembly groove.

Figure 16:
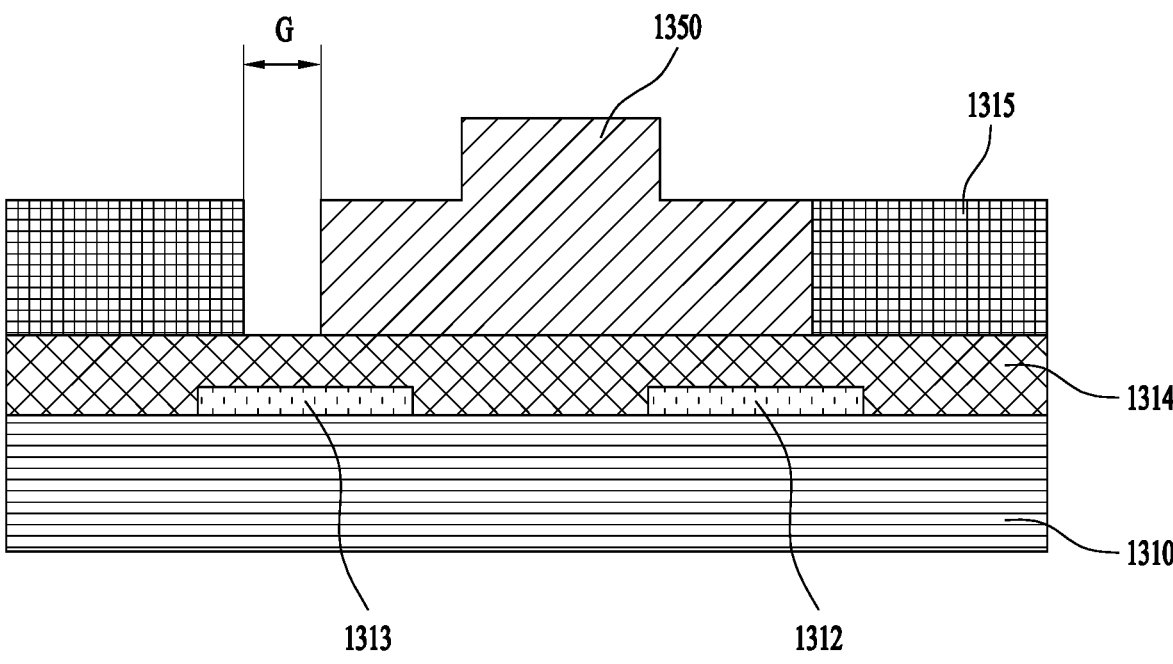
FIG. 16 is a diagram illustrating an example of an assembly error between semiconductor LEDs that may occur in the self-assembly process.

FIG. 16 is a diagram illustrating an example of an assembly error between semiconductor LEDs that may occur in the self-assembly process.

Referring to FIG. 16, after completion of the self-assembly process, the semiconductor LED 1350 may be disposed in the assembly groove of the assembly substrate. The assembly substrate may include assembly electrodes 1312 and 1313 for applying a voltage to the substrate 1310, an insulation layer 1314 for protecting the assembly electrodes 1312 and 1313, and a barrier 1315 for forming the assembly groove.

In general, during the self-assembly process, the width of the assembly grove may be slightly larger than that of the semiconductor LED to be assembled. If the width of the semiconductor LED is identical to that of the assembly groove, the semiconductor LEDs can be accurately assembled at an intended position, but the time required for assembly of the semiconductor LEDs may unavoidably increase.

Meanwhile, a difference in width between the assembly groove and the semiconductor LED may cause an assembly error in the process of assembling the semiconductor LEDs. In addition, the assembly error may bring about occurrence of a defect in the wiring process. For example, as shown in FIG. 16, when the semiconductor LEDs 1350 are assembled to be biased in one direction within the assembly groove, the assembly error of G may occur. When the semiconductor LEDs to be assembled are small in size and the distance between different wiring electrodes connected to the semiconductor LEDs is similar to the assembly error, the semiconductor LEDs may cause short-circuiting.

Therefore, a new type of semiconductor LED for preventing either an arrangement error caused by the stamp process described in FIG. 12 or a defective wiring caused by the assembly error in the self-assembly process shown in FIG. 16 may be required. Thereafter, a display device using the semiconductor LEDs each having a side electrode as the above-described new semiconductor LED, and a method for manufacturing the same will hereinafter be described with reference to FIGS. 17 to 27.

Figure 17:
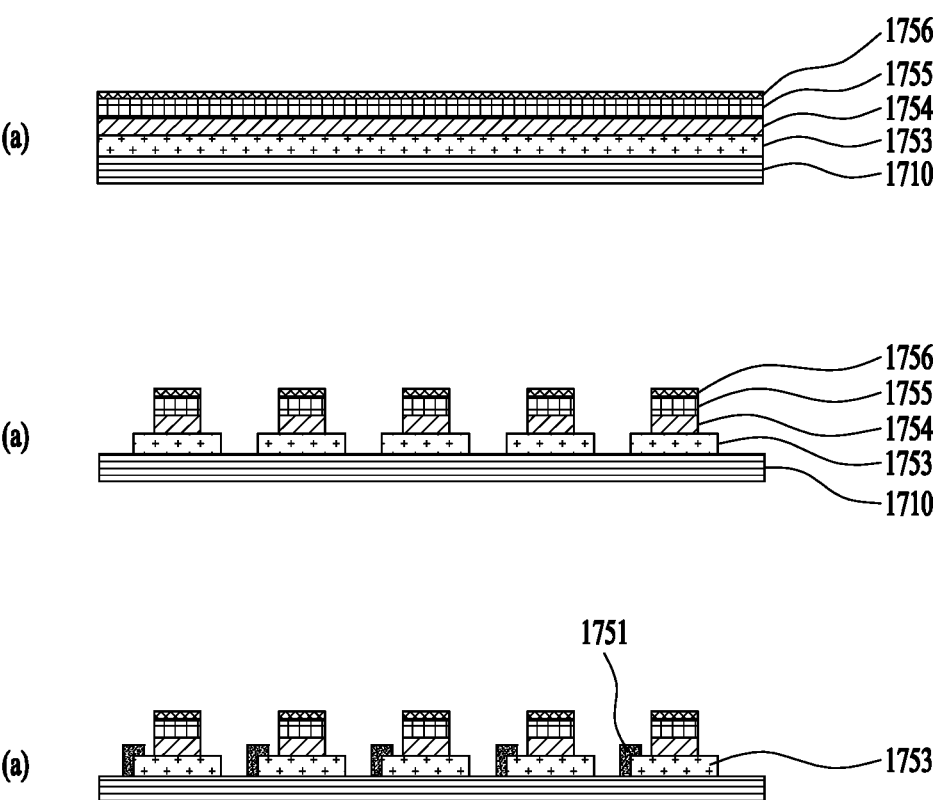
FIG. 17 is a diagram illustrating a method for manufacturing the semiconductor LEDs, each of which has a side electrode.

FIG. 17 is a diagram illustrating a method for manufacturing the semiconductor LEDs, each of which has a side electrode.

Referring to FIG. 17(*a*), a first conductive semiconductor layer 1753, an active layer 1754, a second conductive semiconductor layer 1755, and a second conductive electrode 1756 may be formed over the growth substrate 1710. The second conductive electrode 1756 may be formed separately after a mesa-shaped semiconductor LED structure shown in FIG. 17(*b*) has been completely fabricated.

Thereafter, as shown in FIG. 17(*b*), the mesa-shaped semiconductor LED structure may be formed over the growth substrate 1710 through the etching process. The semiconductor LED structure may overlap the active layer 1754, the second conductive semiconductor layer 1755, and the second conductive electrode 1756. Some regions of the active layer 1754, the second conductive semiconductor layer 1755, and the second conductive electrode 1756 may be etched more than the first conductive semiconductor layer 1753, resulting in formation of the mesa-shaped semiconductor LED structure. Therefore, the edge of the first conductive semiconductor layer 1753 may be stepped between the active layer 1754, the first conductive semiconductor layer 1753, and the growth substrate 1710.

Thereafter, as shown in FIG. 17(*c*), the first conductive electrode 1751 may be formed on at least one stepped portion of the first conductive semiconductor layer 1753.

Figure 18:
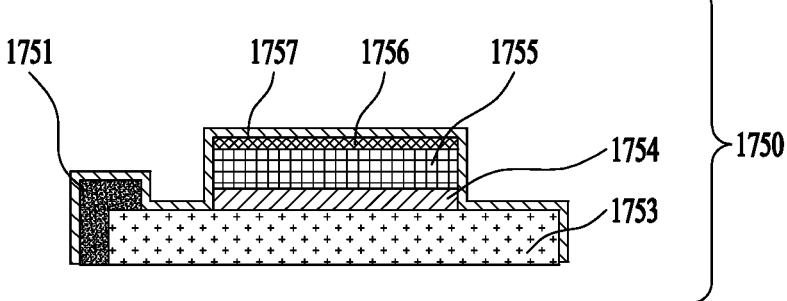
FIG. 18 is a diagram illustrating a structure of a semiconductor LED according to the present disclosure.

FIG. 18 is a diagram illustrating a structure of the semiconductor LED according to the present disclosure.

Referring to FIG. 18, the semiconductor LED 1750 may be constructed such that a passivation layer 1757 is formed on a top surface and a side surface of the semiconductor LED structure having a side electrode (first conductive electrode) shown in FIG. 17(*c*). The passivation layer 1757 may be formed before being separated from the growth substrate 1757. After the passivation layer 1757 is separated from the growth substrate, a separate passivation layer may also be formed below the semiconductor LED.

The semiconductor LED 1750 may include a first conductive semiconductor layer 1753, a second conductive semiconductor layer 1755 formed over the first conductive semiconductor layer 1753, an active layer 1754 disposed between the first conductive semiconductor layer 1753 and the second conductive semiconductor layer 1755, a second conductive electrode 1756 disposed over the second conductive semiconductor layer 1755, and a first conductive electrode 1751 and a passivation layer 1757 that are disposed over a stepped portion of the first conductive semiconductor layer 1753 exposed by etching of some portions of the second conductive semiconductor layer 1755 and the active layer 1754.

Figure 19:
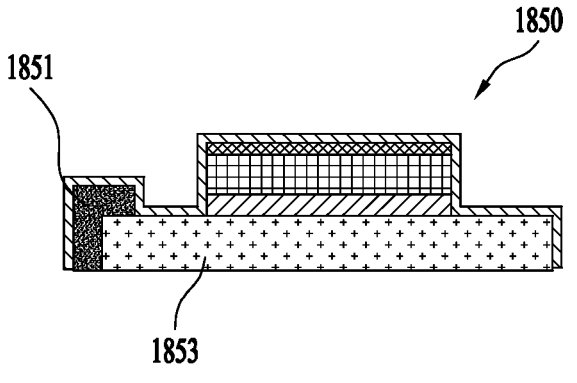
FIG. 19 illustrates various examples of a semiconductor LED having a side electrode.
Figure 19:
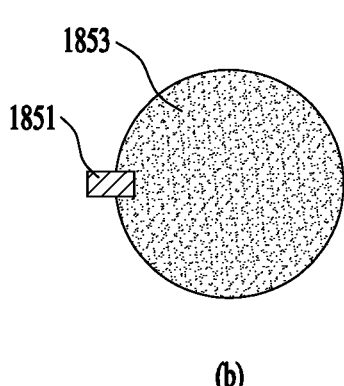
Figure 19:
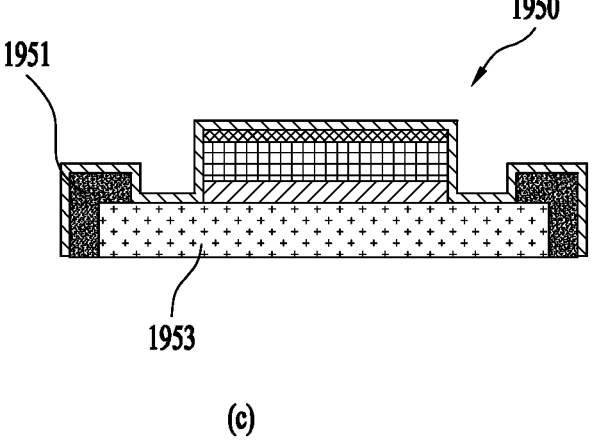
Figure 19:
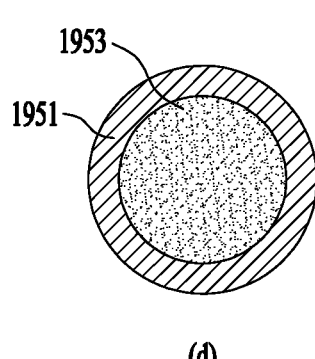

FIG. 19 illustrates various examples of the semiconductor LED having a side electrode.

As shown in FIG. 19(*a*), a side electrode may be formed of a first conductive electrode 1851 disposed on a stepped portion of one side of the first conductive semiconductor layer 1853 of the semiconductor LED 1850. In this case, when the semiconductor LED 1850 is viewed from the plane, the semiconductor LED 1850 may be represented in a shape of the first conductive electrode 1851 protruding toward the side surface of the first conductive semiconductor layer 1853 as shown in FIG. 19(*b*). Although FIG. 19(*b*) shows only one first conductive electrode 1851 for convenience of description, the scope or spirit of the present disclosure is not limited thereto, the plurality of first conductive electrodes 1851 may also be formed as side electrodes as needed.

In addition, as shown in FIG. 19(*c*), the side electrode may also be formed of the first conductive electrode 1951 located at all side surfaces of the first conductive semiconductor layer 1953 of the semiconductor LED 1950. In this case, when the semiconductor LED 1950 is viewed from the plane, the semiconductor LED 1950 may also be represented in a shape of the first conductive electrode 1951 surrounding the edge of the first conductive semiconductor layer 1953.

Figure 20:
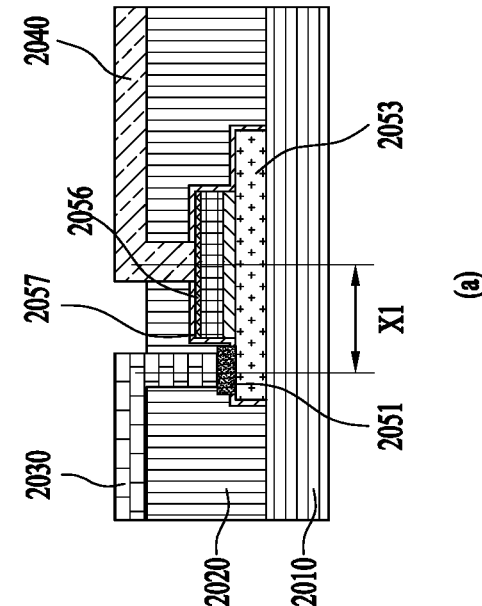
FIG. 20 illustrates the effect of semiconductor LEDs each having a side electrode as compared to the conventional structure.

FIG. 20 illustrates the effect of semiconductor LEDs each having a side electrode as compared to the conventional structure.

FIG. 20(*a*) is a cross-sectional view illustrating the structure formed when the wiring process is performed on a general horizontal semiconductor LED. The semiconductor LED may be formed over the substrate 2010, resulting in formation of an interlayer insulation layer 2020 surrounding the semiconductor LED. Thereafter, the interlayer insulation layer 2020 and some regions of the passivation layer 2057 of the semiconductor LED may be etched such that a first wiring electrode 2030 connected to the first conductive electrode 2051 of the semiconductor LED and a second wiring electrode 2040 connected to the second conductive electrode 2056 may be formed.

In this case, the first conductive electrode 2051 may be disposed at a top surface of the first conductive semiconductor layer 2053. Therefore, a pitch between the first wiring electrode 2030 and the second wiring electrode 2040 may have a length of X1 as shown in FIG. 20(*a*).

On the other hand, FIG. 20(*b*) is a cross-sectional view illustrating the structure formed when the wiring process is performed on a horizontal semiconductor LED having a side electrode according to the present disclosure.

The side wiring may be formed in a shape of the first conductive electrode 2052 at a stepped portion of one side of the first conductive semiconductor layer of the semiconductor LED, and the first wiring electrode 2031 may be disposed over the first conductive electrode 2052 so that the first wiring electrode 2031 is electrically connected to the first conductive electrode 2052.

Therefore, the pitch between the first wiring electrode 2031 and the second wiring electrode 2041 may have a length of X2 as shown in FIG. 20(*b*).

Since the length of X2 is formed over the side electrode, the pitch between the wiring electrodes 2013 and 2041 can be widened by a length formed when the side electrode is additionally formed in the side direction. As a result, the pitch between the wiring electrodes 2013 and 2041 may be longer than the length of X1 shown in FIG. 20(*a*).

On the other hand, as the semiconductor LED is reduced in size, the pitch between the first wiring electrode and the second wiring electrode may decrease. Also, when the arrangement error additionally occurs in the transfer process, there is a high possibility of short-circuiting between the first wiring electrode and the second wiring electrode in the wiring process. Therefore, as shown in FIG. 20(*b*), when the side electrode is provided in the side surface of the semiconductor LED, the pitch between the first wiring electrode and the second wiring electrode may increase so that an additional process margin can be guaranteed, resulting in prevention of a wiring defect.

Figure 21:
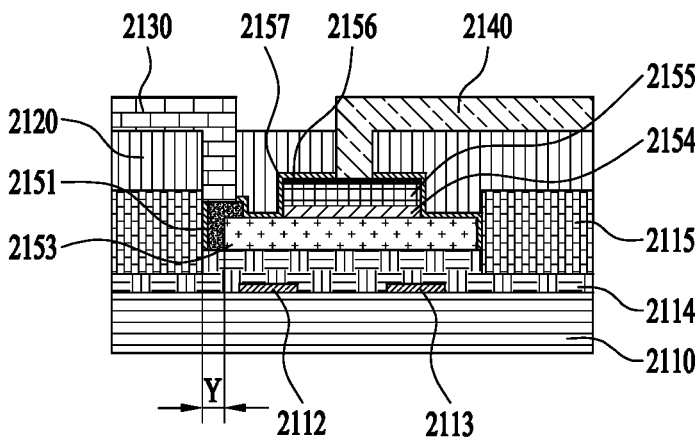
FIG. 21 is a cross-sectional view illustrating an example of the semiconductor LED implemented when the self-assembly process and the wiring process are performed on the semiconductor LED having a side electrode.

FIG. 21 is a cross-sectional view illustrating an example of the semiconductor LED implemented when the self-assembly process and the wiring process are performed on the semiconductor LED having a side electrode.

Referring to FIG. 21, after completion of the self-assembly process, the semiconductor LED may be disposed in the assembly groove of the assembly substrate. The assembly substrate may include assembly electrodes 2112 and 2113 for applying a voltage to the substrate 2110, an insulation layer 2114 for protecting the assembly electrodes 2112 and 2113, and a barrier 2115 for forming the assembly groove.

In addition, the semiconductor LED may include a first conductive semiconductor layer 2153, a second conductive semiconductor layer 2155 formed over the first conductive semiconductor layer 2153, an active layer 2154 disposed between the first conductive semiconductor layer 2153 and the second conductive semiconductor layer 2155, a second conductive electrode 2156 formed over the second conductive semiconductor layer 2155, and a first conductive electrode 2151 and a passivation layer 2156 that are disposed on a stepped portion of the first conductive semiconductor layer 2153 exposed by etching of some parts of the second conductive semiconductor layer 2155 and the active layer 2154.

In addition, as shown in FIG. 21, an interlayer insulation layer 2120 surrounding the semiconductor LED through the wiring process may be formed, a first wiring electrode 2130 connected to the first conductive electrode 2151 of the semiconductor LED may be formed by etching of some parts of the passivation layer 2157 of the semiconductor LED, and a second wiring electrode 2140 connected to the second conductive electrode 2156 may then be formed.

The semiconductor LED having a side surface where the first conductive electrode 2151 is formed may be constructed in a manner that the pitch between the first wiring electrode 2130 and the second wiring electrode 2140 may increase by the distance of Y shown in FIG. 21 as compared to the conventional self-assembly element.

Figure 22:
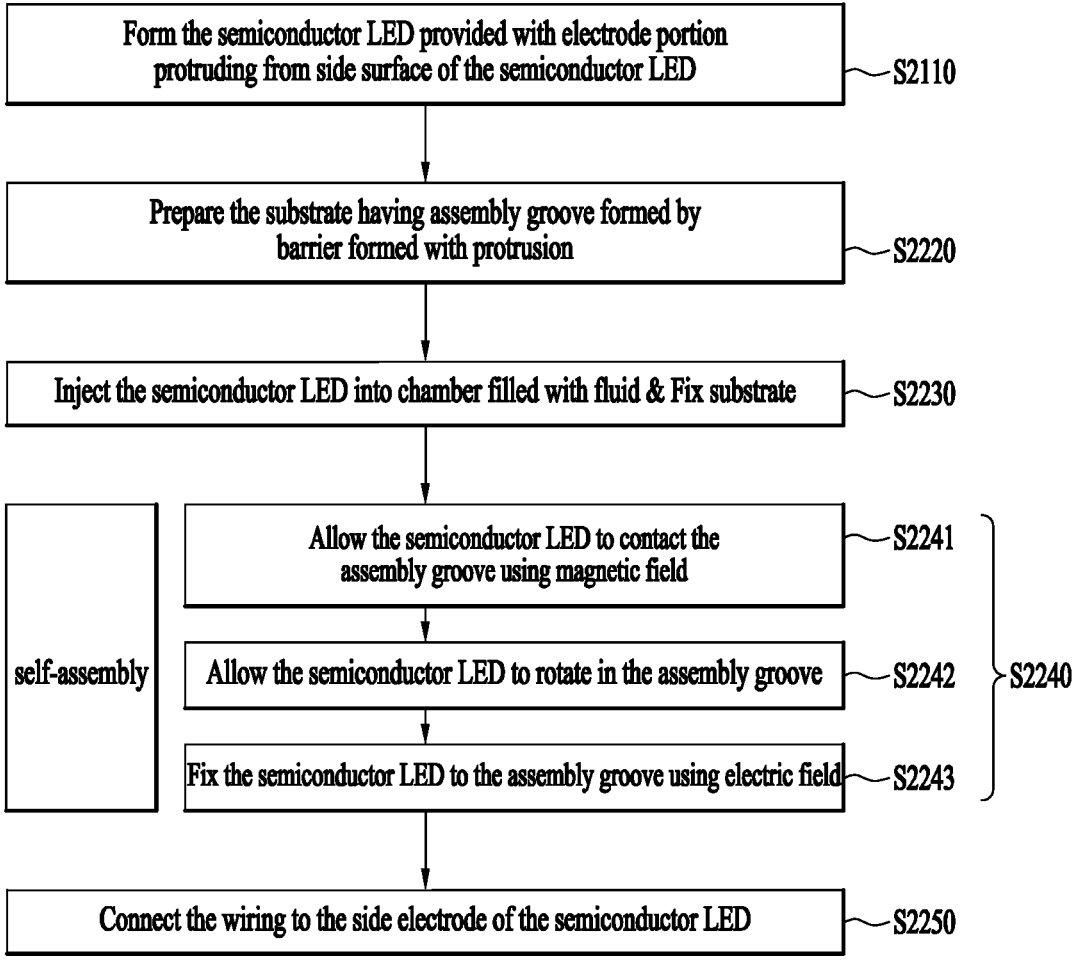
FIG. 22 is a flowchart illustrating a method for manufacturing a display device using both a semiconductor LED having a side electrode and a substrate having a partition wall (barrier) formed with a protrusion.

FIG. 22 is a flowchart illustrating a method for manufacturing a display device using both a semiconductor LED having a side electrode and a substrate having a partition wall (barrier) formed with a protrusion.

In more detail, as shown in FIG. 19(a), the side electrode may be constructed such that a first conductive electrode protruding toward one side surface of the first conductive semiconductor layer is formed.

First, the semiconductor LED having an electrode portion protruding from the side surface of the semiconductor LED may be formed (S2210).

Thereafter, a substrate including one or more assembly grooves defined by the barrier formed with protrusion(s) may be provided (S2220).

The protrusion may be formed to protrude inward from the assembly groove.

Thereafter, the semiconductor LED may be introduced into the chamber including fluid, and the substrate having the assembly groove may be fixed to the top surface of the chamber (S2230).

After that, the self-assembly process may be performed (S2240).

The self-assembly process (S2240) may be largely classified into three stages.

First, a magnetic field may occur in a back surface portion of the substrate having no assembly groove using the assembly device including a magnetic body, and the semiconductor LED may be in contact with the assembly groove by the above-described magnetic field (S2241).

Thereafter, the semiconductor LED may additionally rotate in the assembly groove using the assembly device (S2242).

As described above, the assembly device may rotate in the back surface portion of the substrate, and the semiconductor LED may also rotate in the assembly groove through the above-described rotational motion.

In addition, the protruding side electrode may be disposed at the side surface portion of the semiconductor LED, and may collide with the protrusion of the barrier during rotation thereof, so that the semiconductor LED may be stopped without being rotated any longer. At this time, the protrusion of the barrier and the side electrode of the semiconductor LED may be in contact with each other.

Subsequently, a voltage may be applied to the assembly electrode that has been formed at the bottom surface of the assembly groove, an electric field may occur, and the semiconductor LED may be fixed to the assembly groove using the electric field (S2243).

The step of generating the electric field by applying the voltage to the assembly electrode may be simultaneously performed with the step (S2242) in which the semiconductor LED rotates in the assembly groove using the assembly device. In this case, the strength of the magnetic field is controlled to be stronger than the strength of the electric field, so that it is necessary for the semiconductor LED to rotate in the assembly groove irrespective of occurrence or non-occurrence of dielectrophoresis caused by the electric field.

When the self-assembly process is completed, the substrate is separated from the fluid, and a process of connecting the wiring electrode to the electrode portion including the side electrode of the semiconductor LED assembled into the assembly groove of the substrate may be performed (S2250).

Meanwhile, some steps included in the flowchart shown in FIG. 22 can be deleted or modified without departing from the scope of the present disclosure, as will be appreciated by those skilled in the art.

Figure 23:
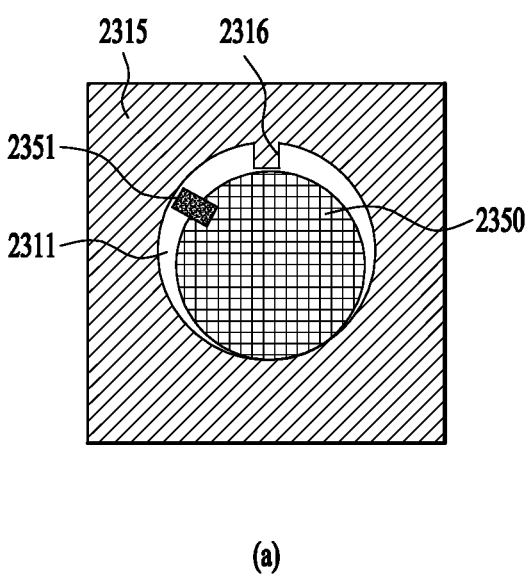
FIG. 23 is a diagram illustrating a fabrication process in which the semiconductor LED rotates in an assembly groove according to the manufacturing method of FIG. 22.
Figure 23:
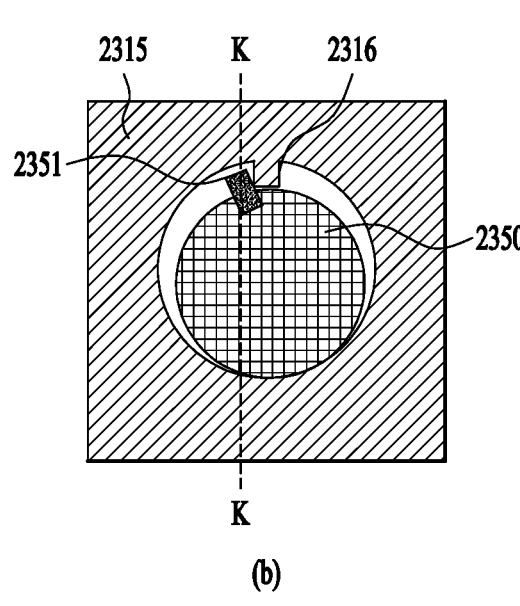

FIG. 23 is a diagram illustrating a fabrication process in which the semiconductor LED rotates in an assembly groove according to the manufacturing method of FIG. 22.

Referring to FIG. 23(a), the semiconductor LED 2350 may be assembled into the assembly groove 2311 defined by the barrier 2315. The barrier 2315 may include a protrusion 2316 protruding inward from the assembly groove 2311. The assembly groove 2311 formed by the barrier 2315 except for the protrusion 2316 may be formed in a circular shape. In addition, the side electrode 2351 protruding outward from the semiconductor LED 2350 may be provided at one side surface of the semiconductor LED 2350. As described above, the side electrode may correspond to the conductive electrode electrically connected to any one of the conductive semiconductor layers of the semiconductor LED 2350.

When the semiconductor LED is assembled into the assembly groove 2311, the side electrode 2351 of the semiconductor LED 2350 can be randomly disposed in the assembly groove, as shown in FIG. 23(a). If the wiring process is performed directly in the above state, a process of confirming a position of the side electrode 2351 of the semiconductor LED 2350 and then removing the interlayer insulation layer and the passivation layer that are disposed at the confirmed position should be performed in advance. The above-described process can be performed individually for a small number of semiconductor LEDs, but it is almost impossible to manufacture the display device using a large number of semiconductor LEDs. Therefore, the position where the side electrode 2351 of the semiconductor LED 2350 is disposed in the assembly groove 2311 should be specified. To this end, an additional process may be performed through the assembly device having a magnetic body to be used for the self-assembly process. Specifically, the above-describe process may include the step of allowing the semiconductor LED 2350 to rotate in the assembly groove 2311 using the rotational motion of the assembly device previously described in FIG. 15.

By the magnetic field generated by rotation of the assembly device, the semiconductor LED 2350 of FIG. 23(a) may rotate clockwise, for example, in the assembly groove 2311. For example, as shown in FIG. 23(b), the side electrode 2351 of the semiconductor LED 2350 does not rotate any longer when coming into contact with the protrusion 2315 of the barrier 2315 and then stops rotation. To this end, each of the semiconductor LED 2350 and the side electrode 2351 of the semiconductor LED 2350 may adjust the protruding length thereof, the diameter of the assembly groove, the protruding length and the shape of the protrusion 2316 formed in the barrier 2315, and the like. For example, each of the semiconductor LED 2350 and the assembly groove other than the side electrode 2351 and the protrusion 2316 may be formed in a circular shape, and may be configured to be advantageous for rotation of the semiconductor LED 2350. Also, for example, the largest width (i.e., a value corresponding to the sum of the diameter of the circular semiconductor LED structure and the protruding length of the side electrode with respect to the assembled surface) of the semiconductor LED 2350 including the side electrode 2351 may be configured to be larger than the shortest width (i.e., a value calculated when the protruding length of the protrusion is subtracted from the diameter of the circular assembly groove) of the assembly groove.

On the other hand, as shown in FIG. 23(*b*), the protrusion 2316 formed in the barrier and only one side electrode of the semiconductor LED 2350 are disclosed only for illustrative purposes, but the scope or spirit of the present disclosure is not limited thereto. For example, the semiconductor LED including not only the assembly groove formed by the barrier formed with the plurality of protrusions, but also the plurality of side electrodes may also be configured. At this time, the number of protrusions and the number of side electrodes can be arbitrarily determined, the scope or spirit of the present disclosure is not limited thereto, and the assembly efficiency compared to the area of the assembly groove can be considered advantageous in the situation where the number of protrusions is identical to the number of side electrodes.

Figure 24:
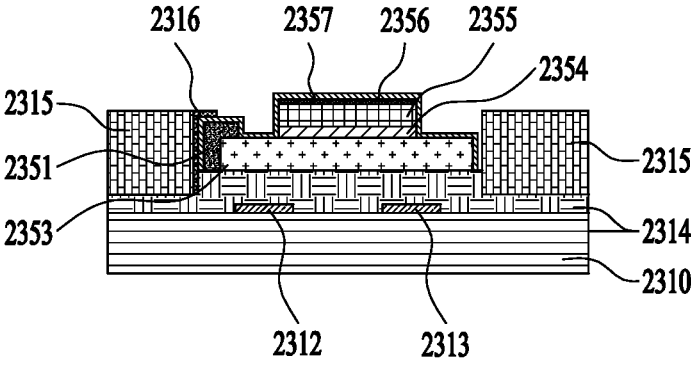
FIG. 24 is a cross-sectional view illustrating the structure taken along the line K-K shown in FIG. 23.

FIG. 24 is a cross-sectional view illustrating the structure taken along the line K-K shown in FIG. 23.

Referring to FIG. 24, the semiconductor LED assembled by the self-assembly process is used, so that the semiconductor LED may be assembled into the assembly groove of the assembly substrate.

In addition, the assembly substrate may include a substrate 2310, the assembly electrodes 2312 and 2313, an insulation layer 2314 for protecting the assembly electrodes 2312 and 2313, and a barrier 2315 for forming the assembly groove. In addition, one side surface of the barrier 2315 may be provided with the protrusion 2316. Furthermore, the side electrode 2351 may overlap with the protrusion 2316. In FIG. 24, the side electrode 2351 may correspond to the first conductive electrode 2351.

The semiconductor LED assembled with the assembly substrate may include, for example, a horizontal semiconductor LED. The semiconductor LED may include a first conductive semiconductor layer 2353, a second conductive semiconductor layer 2355 disposed over the first conductive semiconductor layer 2353, an active layer 2354 disposed between the first conductive semiconductor layer 2353 and the second conductive semiconductor layer 2355, a second conductive electrode 2356 disposed over the second conductive semiconductor layer 2355, a first conductive electrode 2351 disposed over a stepped portion of the first conductive semiconductor layer 2353 exposed by etching of some parts of the second conductive semiconductor layer 2355 and the active layer 2354, and a passivation layer 2357 surrounding a top surface and a side surface of the semiconductor LED.

Figure 25:
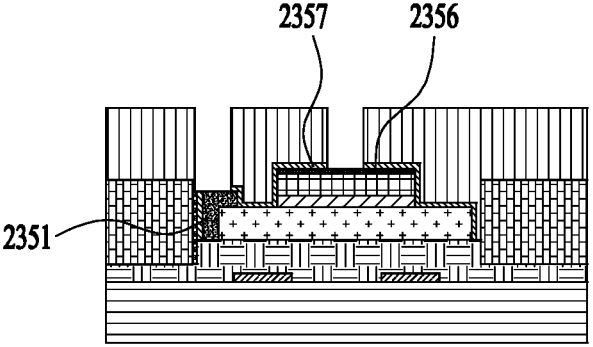
FIG. 25 is a cross-sectional view illustrating the structure implemented after an interlayer insulation layer is formed on the semiconductor LED of FIG. 24 and an etching process for forming wiring electrode(s) is then performed.

FIG. 25 is a cross-sectional view illustrating the structure implemented after an interlayer insulation layer is formed on the semiconductor LED of FIG. 24 and an etching process for forming wiring electrode(s) is then performed.

The etching process may be classified into a dry etching process using plasma ions and a wet etching process using a chemical solution. Only the position where the wiring electrode is formed through the etching process may be selectively etched. To this end, the interlayer insulation layer 2320 may be applied to the top surface and the side surface of the semiconductor LED. The interlayer insulation layer may be an organic material such as a photoresist, and a photolithography process may be performed on the insulation layer.

Specifically, as shown in FIG. 25, for electrical connection to the first conductive electrode 2351, some parts of the interlayer insulation layer 2320 and some parts of the passivation layer 2351 formed over the first conductive electrode 2351 are etched and removed, so that the resultant structure may be exposed on the surface of the first conductive electrode 2351. In addition, for electrical connection to the second conductive electrode 2356, some parts of the interlayer insulation layer 2320 and some parts of the passivation layer 2357 formed over the second conductive electrode 2356 may be etched and removed, so that the resultant structure may be exposed on the surface of the second conductive electrode 2351.

Figure 26:
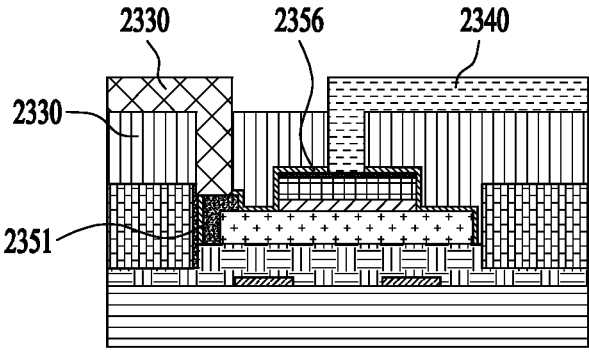
FIG. 26 is a cross-sectional view illustrating the structure implemented after the wiring electrode is formed in the semiconductor LED of FIG. 25.

FIG. 26 is a cross-sectional view illustrating the structure implemented after the wiring electrode is formed in the semiconductor LED of FIG. 25.

Referring to FIG. 26, a first wiring electrode 2330 electrically connected to the first conductive electrode 2351 exposed through the etching process may be formed, and a second wiring electrode 2340 electrically connected to the second conductive electrode 2356 may be formed. The first wiring electrode 2330 and the second wiring electrode 2340 may be insulated by the interlayer insulation layer 2320.

Figure 27:
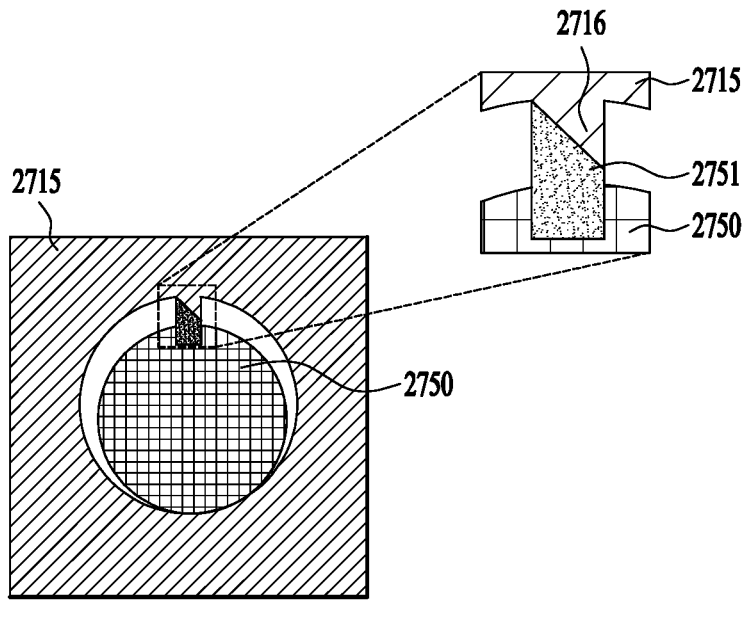
FIG. 27 is a diagram illustrating another example of a semiconductor LED having a side electrode and a partition wall having protrusion(s) according to another embodiment of the present disclosure.

FIG. 27 is a diagram illustrating another example of the semiconductor LED having the side electrode and the barrier having protrusion(s) according to another embodiment of the present disclosure.

Each of the protrusion and the side electrode shown in FIG. 23(*b*) is formed in a square shape, and damage caused by collision between the side electrode and the protrusion may occur in rotation of the side electrode of the semiconductor LED. Therefore, in order to minimize damage that may occur in the above-described collision process, a structure where the side electrode and the protrusion, each of which occupies a predetermined area, are engaged with each other may be provided.

Referring to FIG. 27, the semiconductor LED 2750 may be engaged with the protrusion 2716 through its own rotation in the assembly groove. Specifically, the semiconductor LED 2750 may include a side electrode 2751 having a slope in the direction corresponding to the rotation direction, and a protrusion 2716 formed on the barrier 2715. Each of the protrusions 2716 has an inclined surface opposite to the inclined surface of the side electrode 2751 so that the protrusions 2716 each having a predetermined area may be engaged with each other. For example, the side electrode 2751 of the semiconductor LED 2750 and the protrusion 2716 disposed in the barrier 2715 may be engaged with each other in a serrate shape.

Meanwhile, although only one protrusion 2716 and one side electrode 2751 of the semiconductor LED 2750 are shown in FIG. 27 for convenience of description, the scope or spirit of the present disclosure is not limited thereto.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

What is claimed is:

1. A display device using a semiconductor light emitting diode (LED), the semiconductor LED comprising:
   a substrate;
   an assembly electrode disposed over the substrate;
   an insulation layer disposed over the assembly electrode;
   a barrier disposed over the insulation layer;
   an assembly groove defined by the barrier; and
   a semiconductor LED assembled into the assembly groove,
   wherein the semiconductor LED includes:
   a first conductive semiconductor layer;
   a second conductive semiconductor layer disposed over the first conductive semiconductor layer;
   an active layer disposed between the first conductive semiconductor layer and the second conductive semiconductor layer;
   a second conductive electrode disposed over the second conductive semiconductor layer; and
   a first conductive electrode disposed on a stepped portion of at least one side of the first conductive semiconductor layer exposed by etching of some parts of the second conductive semiconductor layer and the active layer,
   wherein the barrier includes a protrusion protruding inward from the assembly groove,
   wherein the first conductive electrode is formed to protrude from one side of the first conductive semiconductor layer,
   wherein the protrusion of a first conductive electrode includes a first inclined surface,
   wherein the protrusion of the barrier includes a second inclined surface opposite to the first inclined surface, and
   wherein the first and second inclined surfaces are engaged with each other over a predetermined area as the LED is rotated within the assembly groove.

2. The display device according to claim 1, wherein:
   the first conductive electrode is formed to extend from one side of the first conductive semiconductor layer to a portion of a top surface of the first conductive semiconductor layer that is exposed.

3. The display device according to claim 2, wherein:
   the first conductive semiconductor layer of the semiconductor LED is in contact with a bottom surface of the assembly groove; and
   an assembly surface of the first conductive semiconductor layer contacting the bottom surface is formed in a circular shape.

4. The display device according to claim 3, wherein:
   the assembly groove defined by the barrier, other than the protrusion, is formed in a circular shape.

5. The display device according to claim 4, wherein:
   the first conductive electrode of the semiconductor LED and the protrusion located in the barrier are engaged with each other in a serrate shape.

6. The display device according to claim 1, wherein:
   the first conductive electrode is formed on all side surfaces of the first conductive semiconductor layer.

7. The display device according to claim 1, wherein:
   the semiconductor LED includes a magnetic layer.

8. The display device according to claim 1, further comprising:
   a first wiring electrode electrically connected to the first conductive electrode of the semiconductor LED; and
   a second wiring electrode electrically connected to the second conductive electrode of the semiconductor LED.

9. The display device according to claim 1, wherein:
   the semiconductor LED is a micro-LED having a micrometer-scale size.

10. A display device comprising:
   a plurality of semiconductor light emitting diodes (LEDs),
   wherein at least one semiconductor LED of the plurality of semiconductor LEDs comprises:
   a first conductive semiconductor layer;
   a second conductive semiconductor layer disposed over the first conductive semiconductor layer;
   an active layer disposed between the first conductive semiconductor layer and the second conductive semiconductor layer;
   a second conductive electrode disposed over the second conductive semiconductor layer; and
   a first conductive electrode disposed on a stepped portion of at least one side of the first conductive semiconductor layer exposed by etching of some parts of the second conductive semiconductor layer and the active layer,
   wherein the first conductive electrode is formed to protrude from one side of the first conductive semiconductor layer,
   wherein the at least one semiconductor LED is assembled in an assembly groove defined by a barrier;
   wherein the barrier includes a protrusion protruding inward from the assembly groove;
   wherein the protrusion of the first conductive electrode includes a first inclined surface;
   wherein the protrusion of the barrier includes a second inclined surface opposite to the first inclined surface; and
   wherein the first and second inclined surfaces are engaged with each other over a predetermined area as the at least one semiconductor LED is rotated within the assembly groove.

* * * * *